(12) United States Patent
Bao et al.

(10) Patent No.: US 9,478,485 B2
(45) Date of Patent: Oct. 25, 2016

(54) SEMICONDUCTOR DEVICE AND METHOD OF STACKING SEMICONDUCTOR DIE ON A FAN-OUT WLCSP

(71) Applicant: STATS ChipPAC, Ltd., Singapore (SG)

(72) Inventors: XuSheng Bao, Singapore (SG); KwokKeung Szeto, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/261,252

(22) Filed: Apr. 24, 2014

(65) Prior Publication Data

US 2015/0001709 A1  Jan. 1, 2015

Related U.S. Application Data

(60) Provisional application No. 61/841,059, filed on Jun. 28, 2013.

(51) Int. Cl.
*H01L 23/498* (2006.01)
*H01L 23/522* (2006.01)
(Continued)

(52) U.S. Cl.
CPC ..... *H01L 23/49811* (2013.01); *H01L 23/5389* (2013.01); *H01L 24/14* (2013.01); *H01L 24/19* (2013.01); *H01L 24/24* (2013.01); *H01L 24/82* (2013.01); *H01L 24/96* (2013.01); *H01L 24/97* (2013.01); *H01L 25/0657* (2013.01); *H01L 25/50* (2013.01); *H01L 21/561* (2013.01); *H01L 21/568* (2013.01); *H01L 21/6836* (2013.01); *H01L 23/49816* (2013.01); *H01L 23/522* (2013.01); *H01L 24/11* (2013.01); *H01L 24/13* (2013.01); *H01L 2221/6834* (2013.01); *H01L 2221/68327* (2013.01); *H01L 2224/0401* (2013.01); *H01L 2224/04105* (2013.01); *H01L 2224/05548* (2013.01); *H01L 2224/05567* (2013.01); *H01L 2224/05611* (2013.01); *H01L 2224/05624* (2013.01);
(Continued)

(58) Field of Classification Search
CPC ........... H01L 23/49811; H01L 23/522; H01L 24/14; H01L 24/81
USPC .......................................... 257/737; 438/109
See application file for complete search history.

(56) References Cited

U.S. PATENT DOCUMENTS 6,765,299 B2 * 7/2004 Takahashi et al. ........... 257/777
6,847,105 B2 * 1/2005 Koopmans .................... 257/686
(Continued)

*Primary Examiner* — Christine Enad
(74) *Attorney, Agent, or Firm* — Robert D. Atkins; Patent Law Group: Atkins and Associates, P.C.

(57) ABSTRACT

A semiconductor device has a first semiconductor die. A first interconnect structure, such as a conductive pillar including a bump formed over the conductive pillar, and second interconnect structure are formed in a peripheral region of the first semiconductor die. A second semiconductor die is disposed over the first semiconductor die between the first interconnect structure and the second interconnect structure. A height of the second semiconductor die is less than a height of the first interconnect structure. A footprint of the second semiconductor die is smaller than a central region of the first semiconductor die. An encapsulant is deposited over the first semiconductor die and second semiconductor die. Alternatively, the second semiconductor die is disposed over a semiconductor package including a plurality of interconnect structures. External connectivity from the single side fo-WLCSP is performed without the use of conductive vias to provide a high throughput and device reliability.

27 Claims, 17 Drawing Sheets

(51) Int. Cl.
*H01L 23/00* (2006.01)
*H01L 23/538* (2006.01)
*H01L 25/065* (2006.01)
*H01L 25/00* (2006.01)
H01L 21/56 (2006.01)
H01L 21/683 (2006.01)

(52) U.S. Cl.
CPC ........... *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1145* (2013.01); *H01L 2224/1147* (2013.01); *H01L 2224/11334* (2013.01); *H01L 2224/11452* (2013.01); *H01L 2224/11849* (2013.01); *H01L 2224/12105* (2013.01); *H01L 2224/13013* (2013.01); *H01L 2224/13014* (2013.01); *H01L 2224/13082* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/14134* (2013.01); *H01L 2224/14135* (2013.01); *H01L 2224/244* (2013.01); *H01L 2224/24147* (2013.01); *H01L 2224/821* (2013.01); *H01L 2224/8236* (2013.01); *H01L 2224/94* (2013.01); *H01L 2225/06517* (2013.01); *H01L 2225/06527* (2013.01); *H01L 2225/06568* (2013.01); *H01L 2225/06586* (2013.01); *H01L 2924/01322* (2013.01); *H01L 2924/12041* (2013.01); *H01L 2924/12042* (2013.01); *H01L 2924/13091* (2013.01); *H01L 2924/181* (2013.01)

(56) References Cited

U.S. PATENT DOCUMENTS

| | | | |
|---|---|---|---|
| 6,958,537 B2* | 10/2005 | Eng et al. | 257/723 |
| 8,288,201 B2 | 10/2012 | Pagaila et al. | |
| 8,354,297 B2 | 1/2013 | Pagaila et al. | |
| 8,642,381 B2 | 2/2014 | Pagaila et al. | |
| 2004/0070064 A1* | 4/2004 | Yamane | H01L 23/3114 257/686 |
| 2009/0230567 A1* | 9/2009 | Kiong et al. | 257/783 |
| 2010/0007019 A1* | 1/2010 | Pendse | H01L 24/29 257/737 |
| 2010/0178731 A1* | 7/2010 | Mihara | 438/107 |
| 2012/0012990 A1* | 1/2012 | Pagaila et al. | 257/659 |
| 2012/0038064 A1* | 2/2012 | Camacho | H01L 24/19 257/777 |
| 2012/0139068 A1* | 6/2012 | Stacey | 257/417 |
| 2013/0071969 A1* | 3/2013 | Vodrahalli | H01L 25/0657 438/107 |
| 2013/0256915 A1* | 10/2013 | Huang | H01L 21/563 257/777 |
| 2013/0341784 A1 | 12/2013 | Lin et al. | |

* cited by examiner

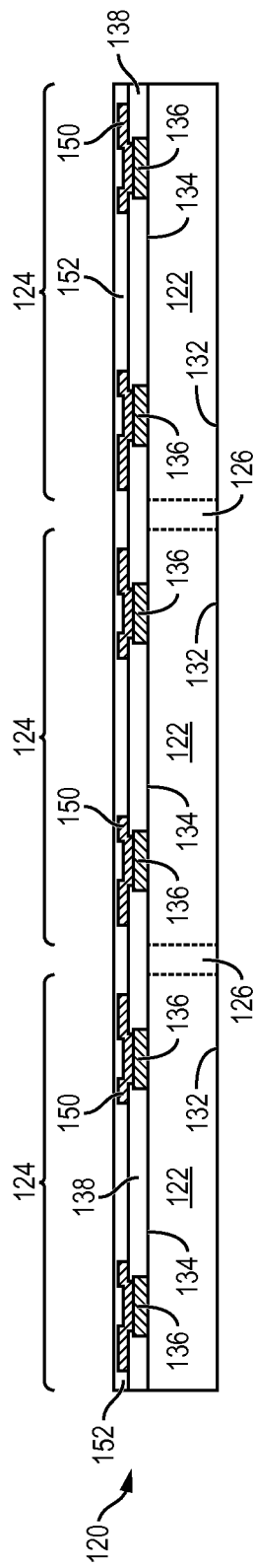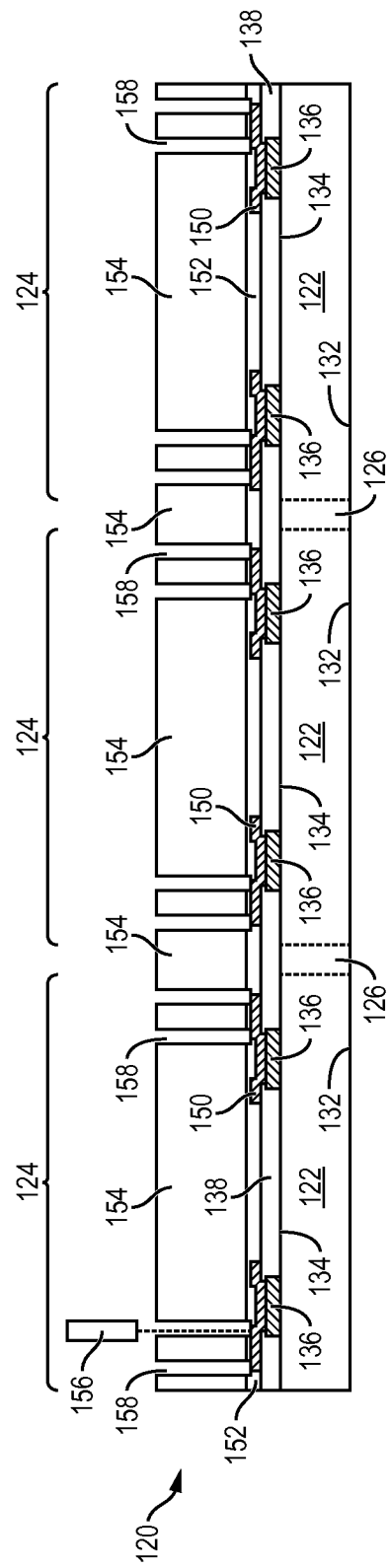

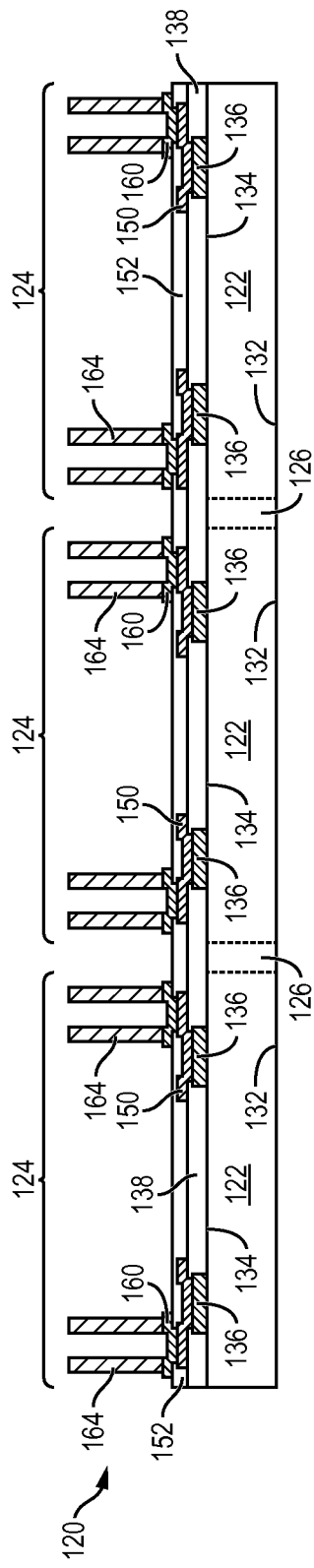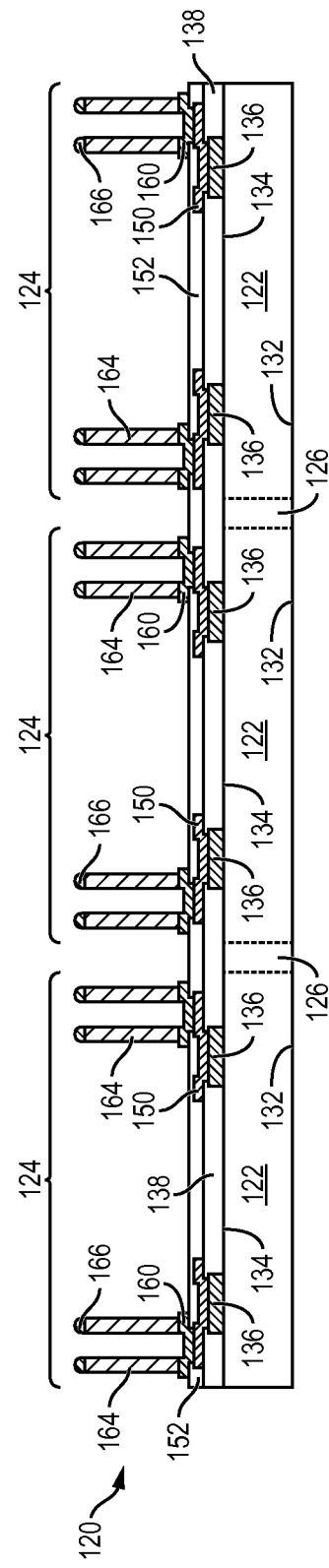

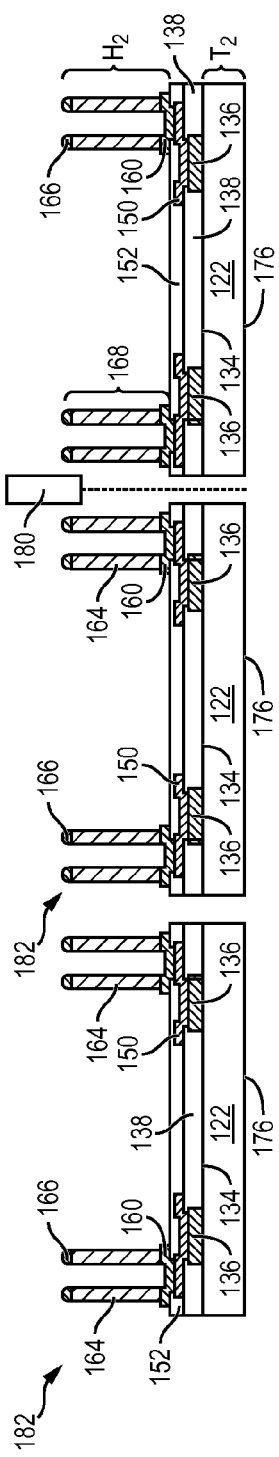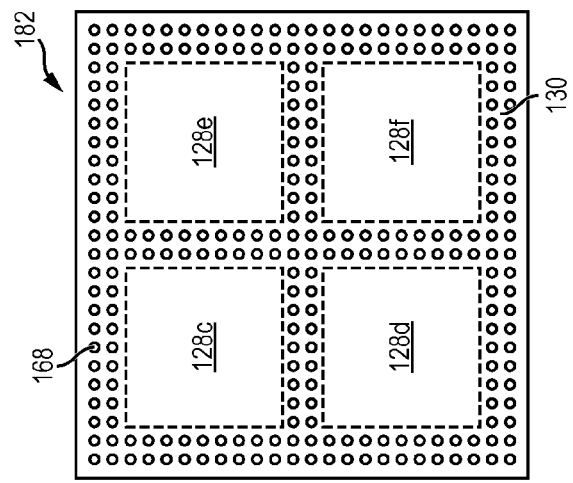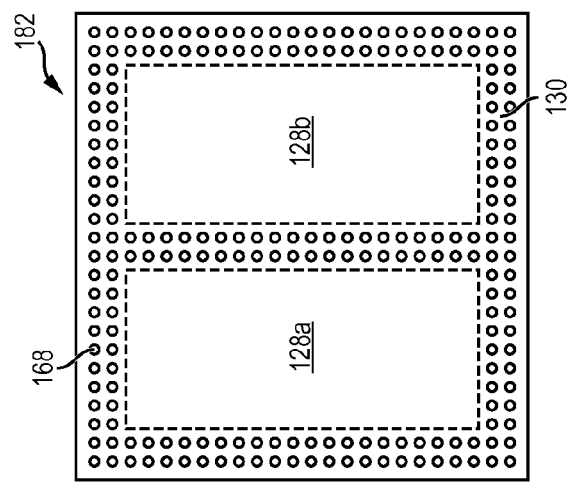
FIG. 2l
FIG. 3a
FIG. 3b
FIG. 3c

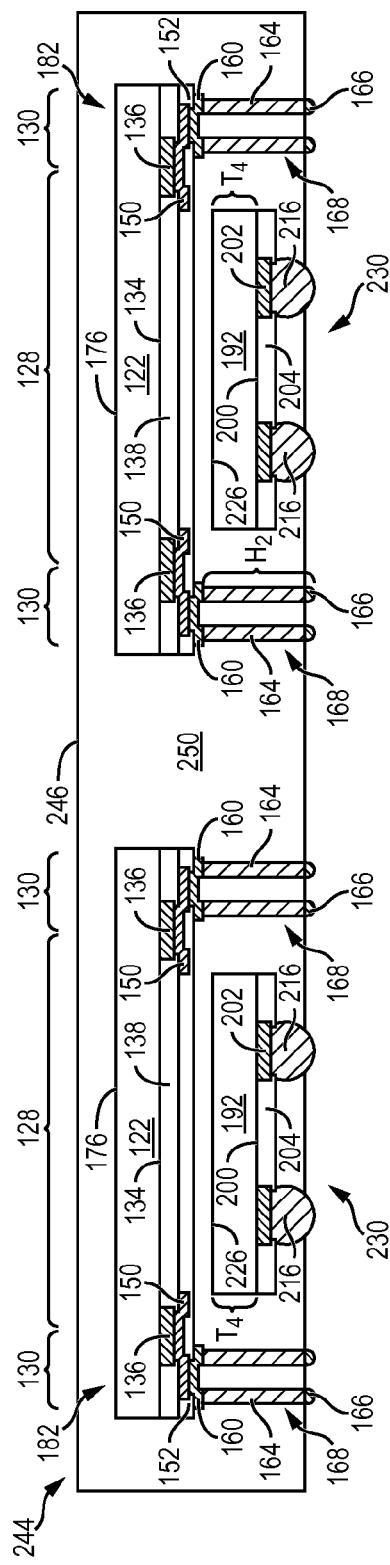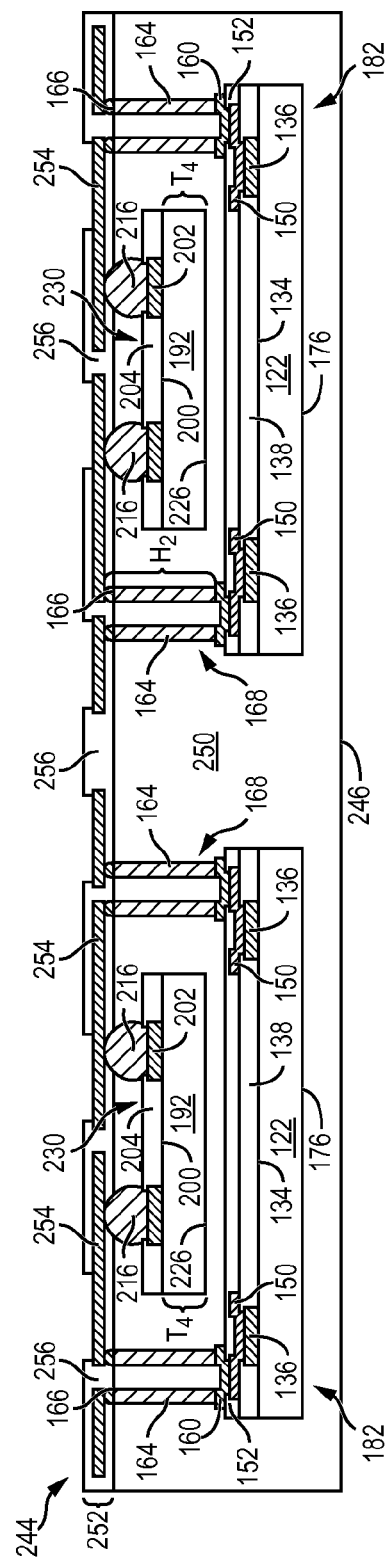

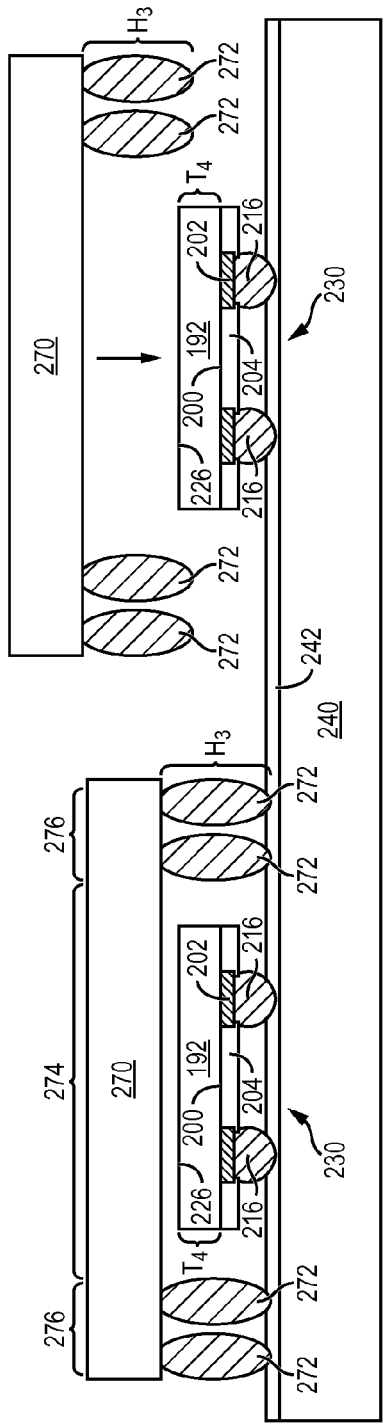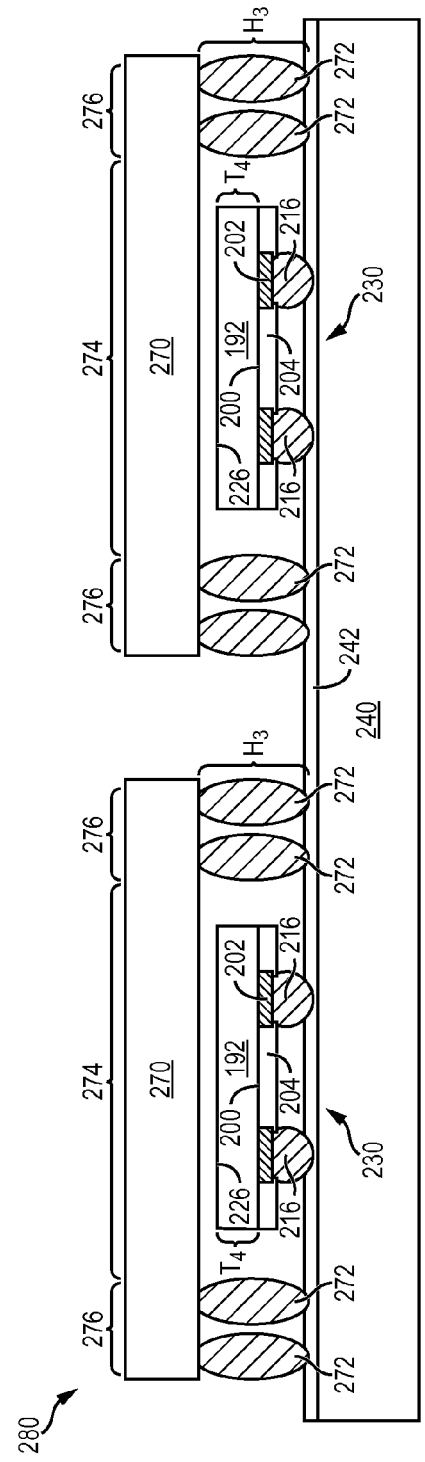

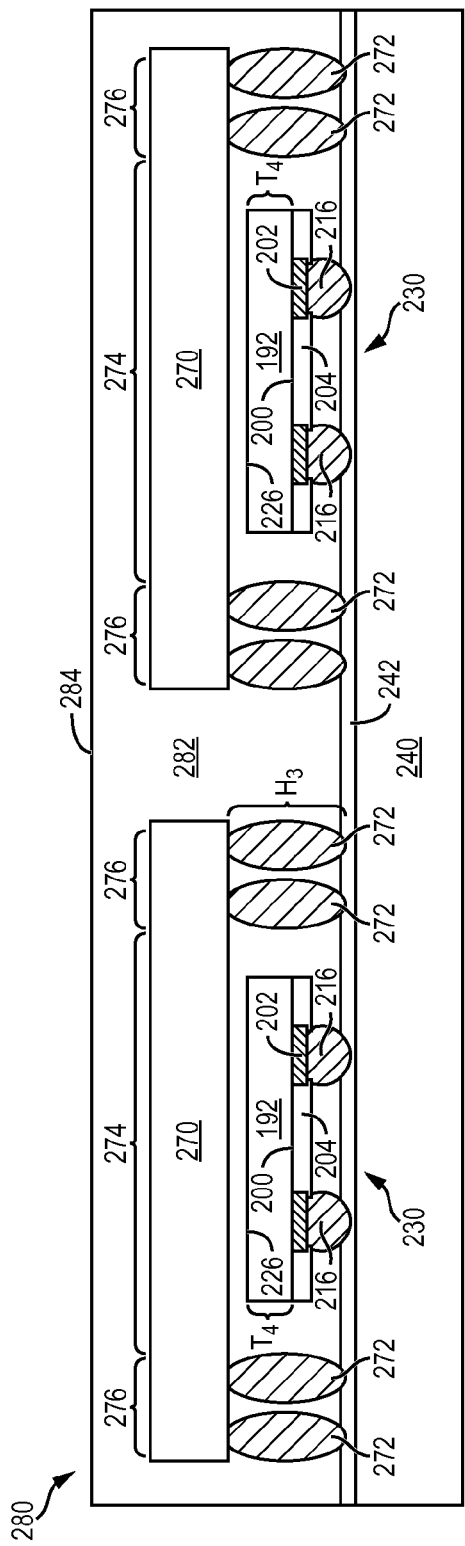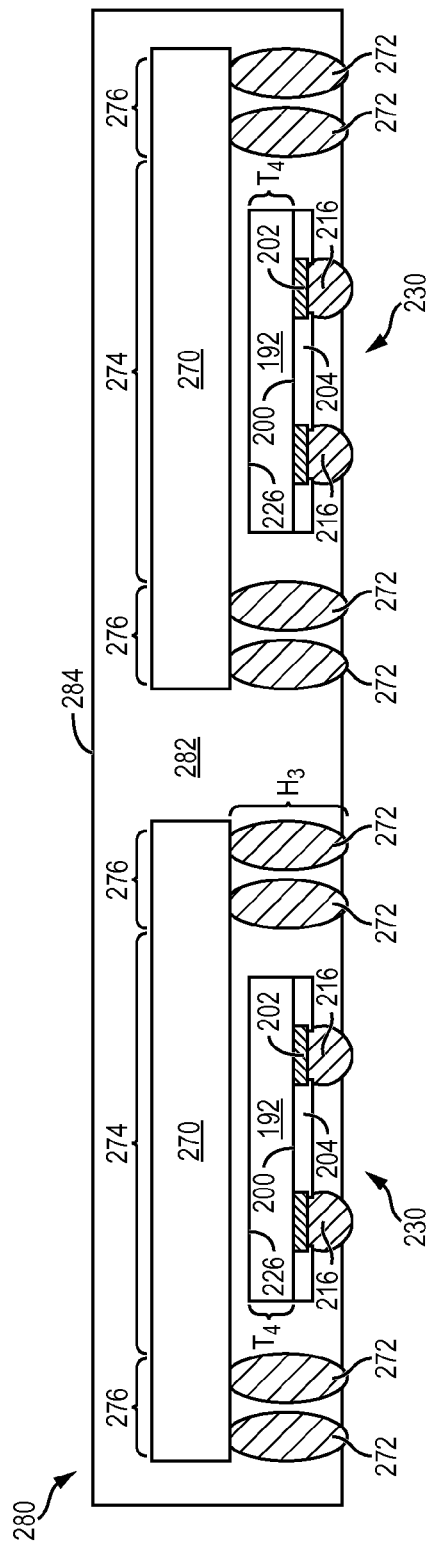

SEMICONDUCTOR DEVICE AND METHOD OF STACKING SEMICONDUCTOR DIE ON A FAN-OUT WLCSP

CLAIM TO DOMESTIC PRIORITY

The present application claims the benefit of U.S. Provisional Application No. 61/841,059, filed Jun. 28, 2013, which application is incorporated herein by reference.

FIELD OF THE INVENTION

The present invention relates in general to semiconductor devices and, more particularly, to a semiconductor device and method of stacking semiconductor die or semiconductor packages using a single side fan-out wafer level chip scale package (FO-WLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the semiconductor material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The manufacturing of smaller semiconductor devices relies on implementing improvements to horizontal and vertical electrical interconnection between multiple semiconductor devices on multiple levels (3-D device integration). Horizontal electrical interconnections include redistribution layers (RDLs) formed as part of FO-WLCSP or embedded wafer-level ball grid arrays (eWLB), which provide electrical connection between a semiconductor die and points external to the package. Vertical interconnection can be accomplished with conductive through silicon vias (TSV) or through hole vias (THV). However, the use of TSVs and THVs typically involves considerable time and equipment, which reduces the unit-per-hour (UPH) production and increases cost. Furthermore, via formation can include formation of voids that reduce device reliability, and can present problems with semiconductor die placement accuracy and warpage control.

SUMMARY OF THE INVENTION

A need exists to increase the density of semiconductor die packages in a manner to achieve lower costs, higher UPH production, and increased device reliability. Accordingly, in one embodiment, the present invention is a method of making a semiconductor device comprising the steps of providing a first semiconductor die, forming a plurality of interconnect structures in a peripheral region of the first semiconductor die, and disposing a second semiconductor die over the first semiconductor die between the interconnect structures.

In another embodiment, the present invention is a method of making a semiconductor device comprising the steps of providing a first semiconductor die, forming a first interconnect structure and a second interconnect structure, and disposing a second semiconductor die over the first semiconductor die between the first interconnect structure and the second interconnect structure.

In another embodiment, the present invention is a semiconductor device comprising a first semiconductor die. A first interconnect structure and a second interconnect structure are formed in a peripheral region of the first semiconductor die. A second semiconductor die is disposed over the first semiconductor die between the first interconnect structure and the second interconnect structure.

In another embodiment, the present invention is a semiconductor device comprising a first semiconductor die. A first interconnect structure and a second interconnect structure are formed over the first semiconductor die. A second semiconductor die is disposed over the first semiconductor die between the first interconnect structure and the second interconnect structure.

BRIEF DESCRIPTION OF THE DRAWINGS

FIGS. 2a-2l illustrate a semiconductor wafer with a plurality of semiconductor die separated by a saw street;

FIGS. 3a-3c illustrate the semiconductor die of FIGS. 2a-2l in plan view;

FIGS. 5a-5i illustrate a process of stacking the semiconductor die of FIGS. 2a-2l and 4a-4f using a single side FO-WLCSP; and FIGS. 6a-6g illustrate a process of stacking a semiconductor package with the semiconductor die of FIGS. 4a-4f using a single side FO-WLCSP.

DETAILED DESCRIPTION OF THE DRAWINGS

Figure 1:
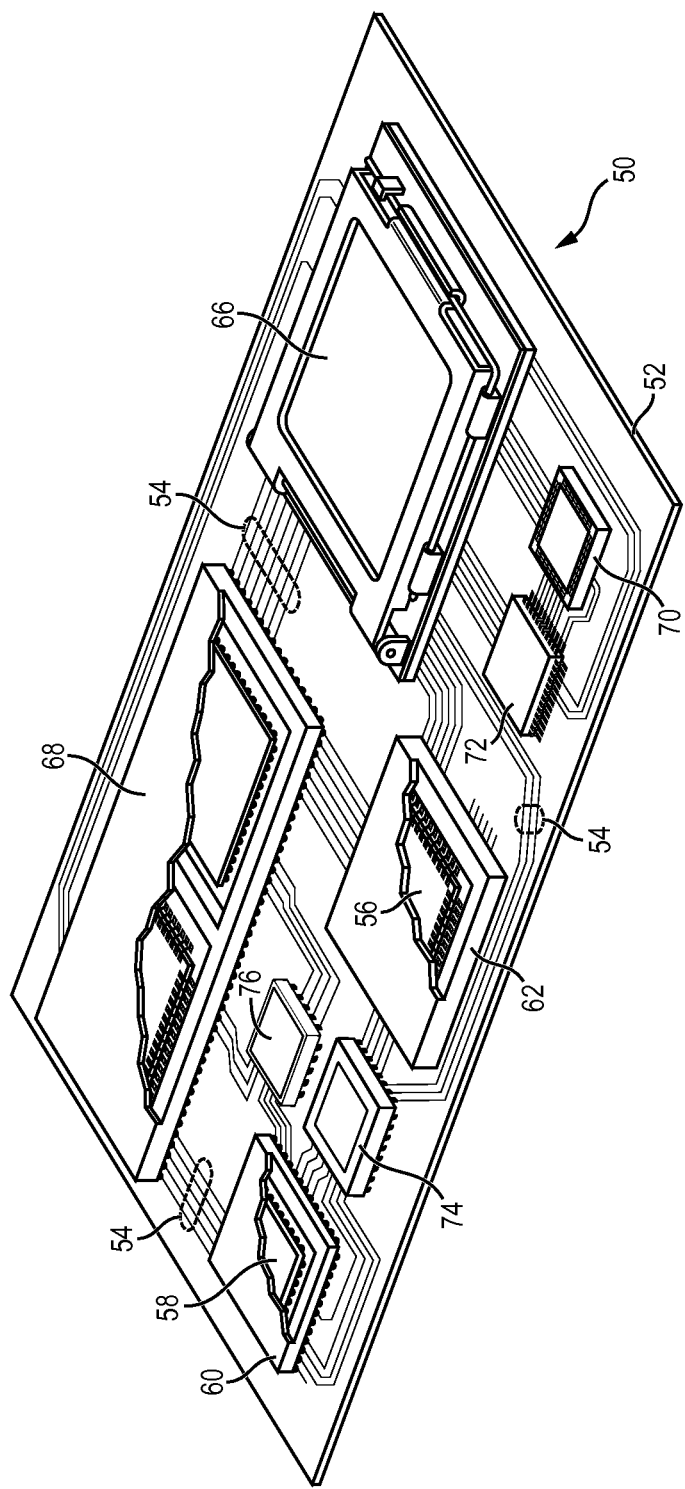
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, eWLB 74, and wafer level chip scale package (WLCSP) 76 are shown mounted on PCB 52. eWLB 74 is a fan-out wafer level package and WLCSP 76 is a fan-in wafer level package (FI-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIGS. 2a-2i illustrate, in relation to FIG. 1, a process of forming a thinned semiconductor die with composite interconnect structures in a peripheral region of the semiconductor die. An RDL routes signals from the circuits in a central region of the semiconductor die to the peripheral region of the semiconductor die. In one embodiment, a portion of the central region of the semiconductor die remains devoid of composite interconnect structures to accommodate a smaller semiconductor die disposed over the semiconductor die in a subsequent processing step. In another embodiment, rows of composite interconnect structures may divide the central region into smaller regions to accommodate stacking more than one smaller semiconductor die over the semiconductor die.

Figure 2A:
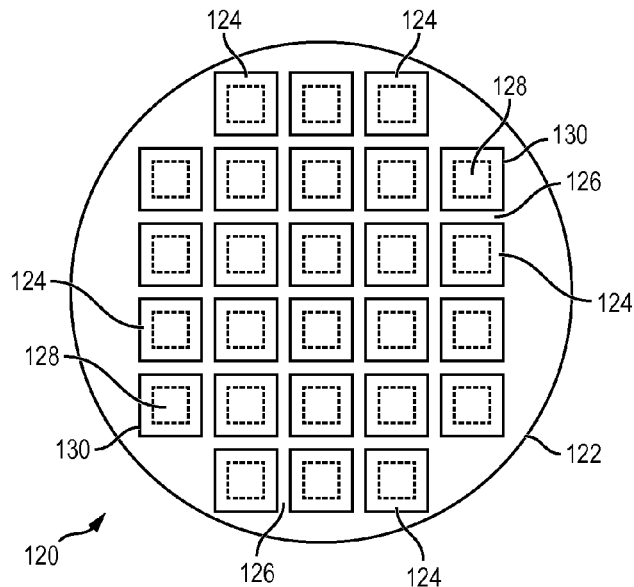

FIG. 2a shows a semiconductor wafer 120 with a base substrate material 122, such as silicon, germanium, aluminum phosphide, aluminum arsenide, gallium arsenide, gallium nitride, indium phosphide, or silicon carbide, or other bulk semiconductor material for structural support. In one embodiment, semiconductor wafer 120 has a width or diameter of 100-450 mm. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. Each semiconductor die 124 has a central region 128 and a peripheral region 130. In one embodiment, central region 128 has a square or rectangular shape.

Figure 2B:
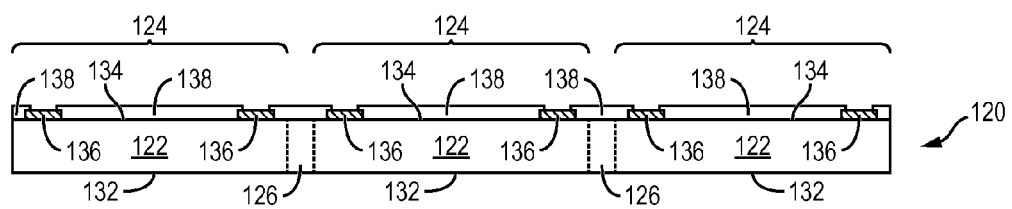

FIG. 2b shows a cross-sectional view of a portion of semiconductor wafer 120. Each semiconductor die 124 has a back or non-active surface 132 and an active surface 134 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 134 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 136 is formed over active surface 134 using PVD, CVD, electrolytic plating, electroless plating process, or other suitable metal deposition process. Conductive layer 136 can be one or more layers of aluminum (Al), copper (Cu), tin (Sn), nickel (Ni), gold (Au), silver (Ag), or other suitable electrically conductive material. Conductive layer 136 operates as contact pads electrically connected to the circuits on active surface 134. Conductive layer 136 can be formed as contact pads disposed side-by-side a first distance from the edge of semiconductor die 124, as shown in FIG. 2b. Alternatively, conductive layer 136 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 138 is formed over active surface 134 and conductive layer 136 using PVD, CVD, screen printing, spin coating, spray coating, sintering, or thermal oxidation. The insulating layer 138 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 138 covers and provides protection for active surface 134. A portion of insulating layer 138 is removed by etching, laser direct ablation (LDA), or other suitable process to expose conductive layer 136 for subsequent electrical interconnect.

Figure 2C:
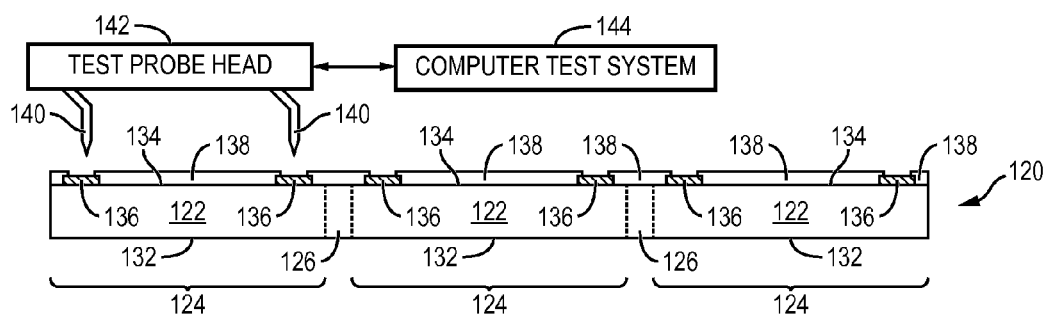

In FIG. 2c, semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters, as shown in FIG. 2c, using a test probe head 142 including a plurality of probes or test leads 140, or other testing device. Probes 140 are used to make electrical contact with nodes or contact pads 136 on each semiconductor die 124 and provide electrical stimuli to the contact pads. Semiconductor die 124 responds to the electrical stimuli, which is measured by computer test system 144 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, an electrically conductive layer or RDL 150 is formed over conductive layer 136 and insulating layer 138 using PVD, CVD, electrolytic plating, electroless plating process, or other suitable metal deposition process. Conductive layer 150 can be one or more layers of Al, Ti, TiW, Cu, Sn, Ni, Au, Ag, or other suitable electrically conductive material. One portion of conductive layer 150 is electrically connected to conductive layer 136. Other portions of conductive layer 150 can be electrically common or electrically isolated depending on the design and function of semiconductor die 124. RDL 150 routes signals away from contact pads 136 in central region 128 of semiconductor die 124 to peripheral region 130 of the semiconductor die. In one embodiment, semiconductor die 124 is any stock or previously designed semiconductor die. Semiconductor die 124 has signals and contact pads 136 in central region 128. A portion of central region 128 of semiconductor die 124 must be devoid of package interconnects to accommodate stacking with smaller semiconductor die. By routing signals away from central region 128 to peripheral region 130, conductive layer 150 enables semiconductor die 124 to accommodate stacking with smaller semiconductor die without customization or redesign of the semiconductor die, saving considerable time and expense and extending the utility of previously designed semiconductor die 124.

An insulating or passivation layer 152 is formed over insulating layer 138 and conductive layer 150 using PVD, CVD, printing, lamination, spin coating, spray coating, sintering, or thermal oxidation. Insulating layer 152 contains one or more layers of SiO2, Si3N4, SiON, Ta2O5, Al2O3, or other material having similar insulating and structural properties. A portion of insulating layer 152 is removed by LDA, etching, or other suitable process to expose conductive layer 150. Conductive layer 150 routes signals away from contact pads 136 in central region 128 of semiconductor die 124 to peripheral region 130 of the semiconductor die. Accordingly, the openings in insulating layer 152 exposing conductive layer 150 are located in peripheral region 130 of semiconductor die 124. Conductive layer 150 in a portion of central region 128 of semiconductor die 124 remains covered by insulating layer 152. The portion of central region 128 of semiconductor die 124 which remains covered by insulating layer 152 corresponds to the footprint of the smaller semiconductor die to be disposed over semiconductor die 124 in a subsequent processing step.

In FIG. 2e, a patterning, or photoresist layer 154 is formed over conductive layer 150 and insulating layer 152 using printing, spin coating, or spray coating. In one embodiment, photoresist layer 154 has a thickness of 40-150 micrometers (μm). A portion of photoresist layer 154 is removed by LDA using laser 156 to form patterned openings 158 and expose conductive layer 150 and insulating layer 152. Alternatively, the portion of photoresist layer 154 is removed by an etching process through a patterned photoresist layer to form patterned openings 158 and expose conductive layer 150 and insulating layer 152. Conductive layer 150 routes signals away from contact pads 136 in central region 128 of semiconductor die 124 to peripheral region 130 of the semiconductor die. Accordingly, patterned openings 158 in photoresist layer 154 exposing conductive layer 150 and insulating layer 152 are located in peripheral region 130 of semiconductor die 124. A portion of central region 128 of semiconductor die 124 remains covered by photoresist layer 154. A portion of central region 128 of semiconductor die 124 is devoid of patterned openings 158 in photoresist layer 154. The portion of central region 128 of semiconductor die 124 which remains covered by photoresist layer 154 corresponds to the footprint of the smaller semiconductor die to be disposed over semiconductor die 124 in a subsequent processing step. In one embodiment, patterned openings 158 have a circular cross-sectional area configured to form conductive pillars with a cylindrical shape including a circular cross-section. In another embodiment, patterned openings 158 have a rectangular cross-sectional area configured to form conductive pillars with a cubic shape including a rectangular cross-section.

Figure 2F:
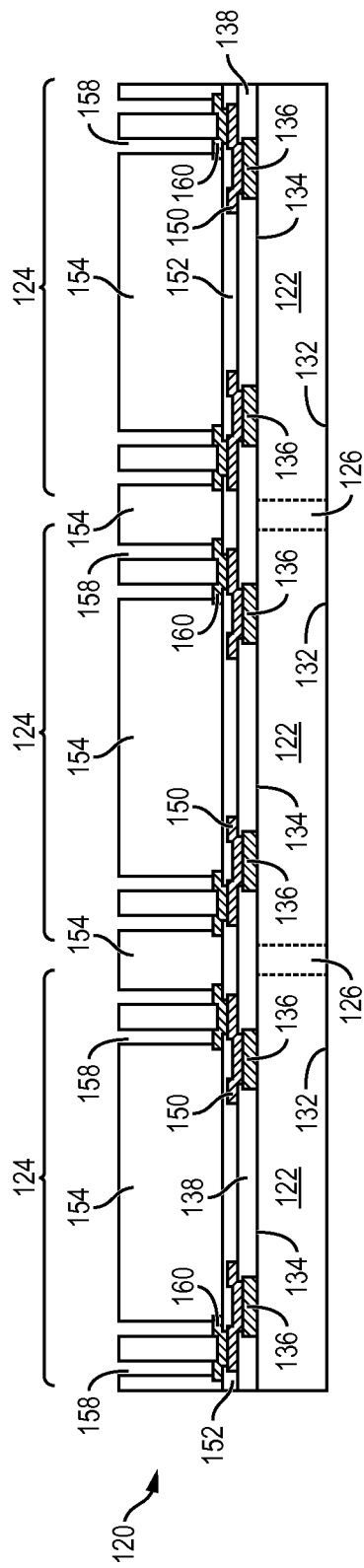

In FIG. 2f, an electrically conductive layer 160 is conformally applied over conductive layer 150 and insulating layer 152, within openings 158, using a patterning and metal deposition process such as printing, PVD, CVD, sputtering, electrolytic plating, and electroless plating. Patterned openings 158 in photoresist layer 154 are located in peripheral region 130 of semiconductor die 124. Accordingly, conductive layer 160 disposed in patterned openings 158 is located in peripheral region 130 of semiconductor die 124. A portion of central region 128 of semiconductor die 124 remains covered by photoresist layer 154. A portion of central region 128 of semiconductor die 124 is devoid of conductive layer 160. The portion of central region 128 of semiconductor die 124 which remains covered by photoresist layer 154 and is devoid of conductive layer 160 corresponds to the footprint of the smaller semiconductor die to be disposed over semiconductor die 124 in a subsequent processing step. Conductive layer 160 can be one or more layers of Al, Cu, Sn, Ti, Ni, Au, Ag, or other suitable electrically conductive material. In one embodiment, conductive layer 160 is a multilayer stack including a seed layer, barrier layer, and adhesion layer. The seed layer can be titanium copper (TiCu), titanium tungsten copper (TiWCu), or tantalum nitrogen copper (TaNCu). The barrier layer can be Ni, nickel vanadium (NiV), platinum (Pt), palladium (Pd), TiW, CrCu, or other suitable material. The adhesion layer can be Ti, TiN, TiW, Al, or chromium (Cr), or other suitable material. Conductive layer 160 follows the contour of conductive layer 150 and insulating layer 152. Conductive layer 160 is electrically connected to conductive layer 150.

Figure 2G:
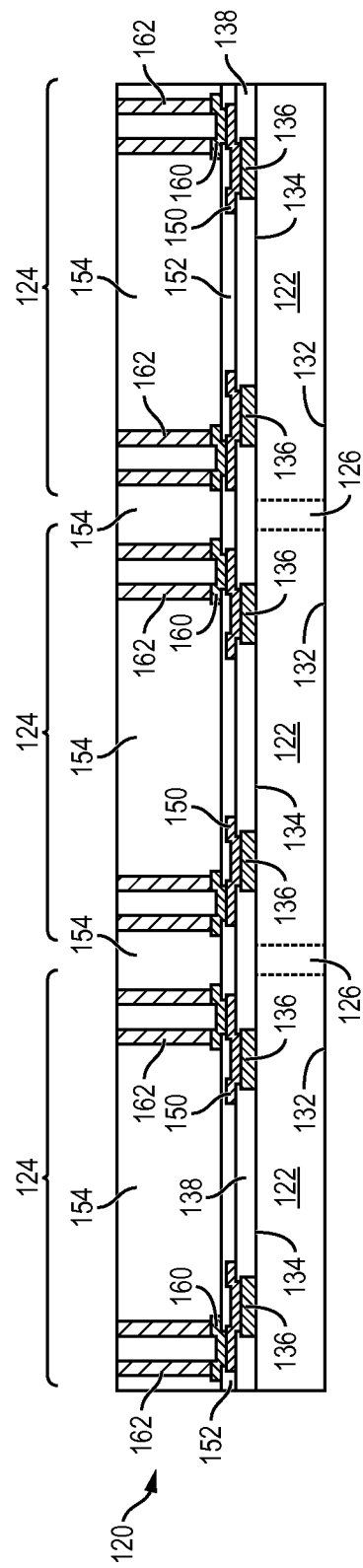

In FIG. 2g, an electrically conductive material 162 is deposited within patterned openings 158 and over conductive layer 160 using an evaporation, sputtering, electrolytic plating, electroless plating, or screen printing process. Conductive material 162 can be Cu, Al, tungsten (W), Au, solder, or other suitable electrically conductive material. In one embodiment, conductive material 162 is deposited by plating Cu in the patterned openings 158 of photoresist layer 154. Patterned openings 158 of photoresist layer 154 are located in peripheral region 130 of semiconductor die 124. Accordingly, conductive material 162 disposed in patterned openings 158 is located in peripheral region 130 of semiconductor die 124. A portion of central region 128 of semiconductor die 124 remains covered by photoresist layer 154. A portion of central region 128 of semiconductor die 124 is devoid of conductive material 162. The portion of central region 128 of semiconductor die 124 which remains covered by photoresist layer 154 and is devoid of conductive material 162 corresponds to the footprint of the smaller semiconductor die to be disposed over semiconductor die 124 in a subsequent processing step. Conductive material 162 is electrically connected to conductive layer 160.

In FIG. 2h, photoresist layer 154 is removed by an etching process to leave individual conductive pillars 164. Conductive pillars 164 can have a cylindrical shape with a circular or oval cross-section, or conductive pillars 164 can have a cubic shape with a rectangular cross-section. Conductive pillars 164 have a height of $H_1$. In one embodiment, conductive pillars 164 can be implemented with stacked bumps or stud bumps. In another embodiment, height, $H_1$, of conductive pillars 164 is 40-150 μm. Conductive material 162 is disposed in patterned openings 158 located in peripheral region 130 of semiconductor die 124. Accordingly, conductive pillars 164 are located in peripheral region 130 of semiconductor die 124. A portion of central region 128 of semiconductor die 124 is devoid of conductive pillars 164. A portion of central region 128 of semiconductor die 124 remains covered by insulating layer 152. The portion of central region 128 of semiconductor die 124 which remains covered by insulating layer 152 and is devoid of conductive pillars 164 corresponds to the footprint of the smaller semiconductor die to be disposed over semiconductor die 124 in a subsequent processing step. Conductive pillars 164 are electrically connected to conductive layer 160.

In FIG. 2i, an electrically conductive bump material is deposited over conductive pillars 164 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material can be reflowed to form a rounded bump cap 166. In some applications, bump caps 166 are reflowed a second time to improve electrical contact to pillars 164. Alternatively, the bump material is deposited prior to removing photoresist layer 154. The combination of conductive pillar 164 and bump cap 166 constitutes a composite interconnect structure 168 with a non-fusible portion (conductive pillar 164) and a fusible portion (bump cap 166). Bump cap 166 is electrically connected to conductive pillar 164. Conductive pillars 164 are located in peripheral region 130 of semiconductor die 124. Accordingly, composite interconnect structures 168 are located in peripheral region 130 of semiconductor die 124. A portion of central region 128 of semiconductor die 124 is devoid of composite interconnect structures 168. A portion of central region 128 of semiconductor die 124 remains covered by insulating layer 152. The portion of central region 128 of semiconductor die 124 which remains covered by insulating layer 152 and is devoid of composite interconnect structures 168 corresponds to the footprint of the smaller semiconductor die to be disposed over semiconductor die 124 in a subsequent processing step. Composite interconnect structures 168 have a height of $H_2$. In one embodiment, height, $H_2$, of composite interconnect structures 168 is 40-150 µm. Composite interconnect structures 168 represent one type of interconnect structure that can be formed over semiconductor die 124. The interconnect structure can also use bumps, conductive paste, stacked stud bump, or other electrical interconnect. Composite interconnect structures 168 are electrically connected to conductive layer 160.

Figure 2J:
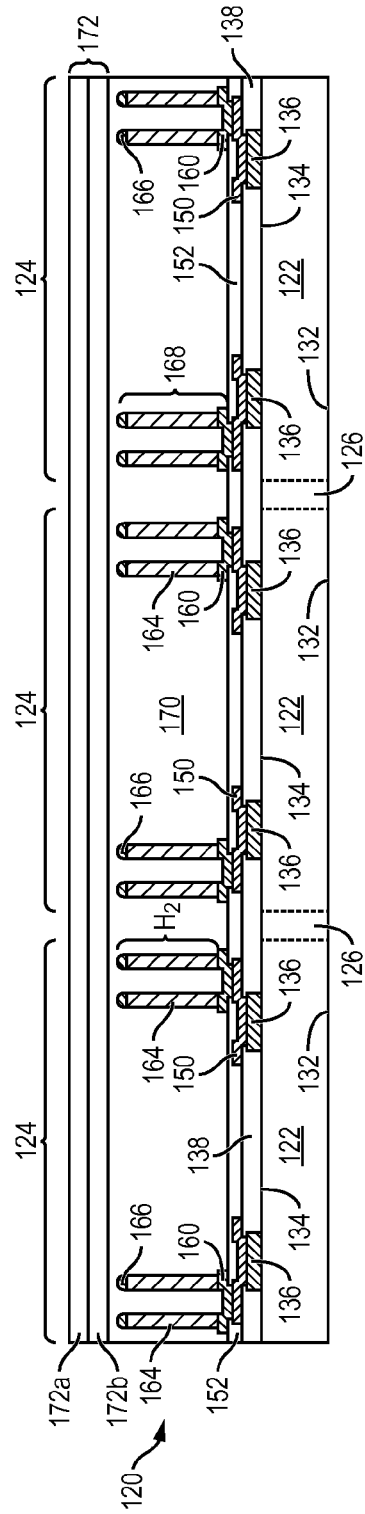

In FIG. 2j, a protective coating 170 is formed over insulating layer 152 and composite interconnect structures 168 across an entire area of semiconductor wafer 120. Protective coating 170 can be one or more layers of a water soluble polymer material applied by screen printing, spin coating, spray coating, or other suitable deposition process. A lamination tape 172 is applied over protective coating 170 across an entire area of semiconductor wafer 120. In one embodiment, lamination tape 172 includes a dielectric base film 172a and adhesive layer 172b, as shown in the cross-sectional view of a portion of semiconductor wafer 120 in FIG. 2j. Protective coating 170 covers active surface 134 of semiconductor wafer 120 including central region 128 and peripheral region 130 of semiconductor die 124 and saw street 126.

Figure 2K:
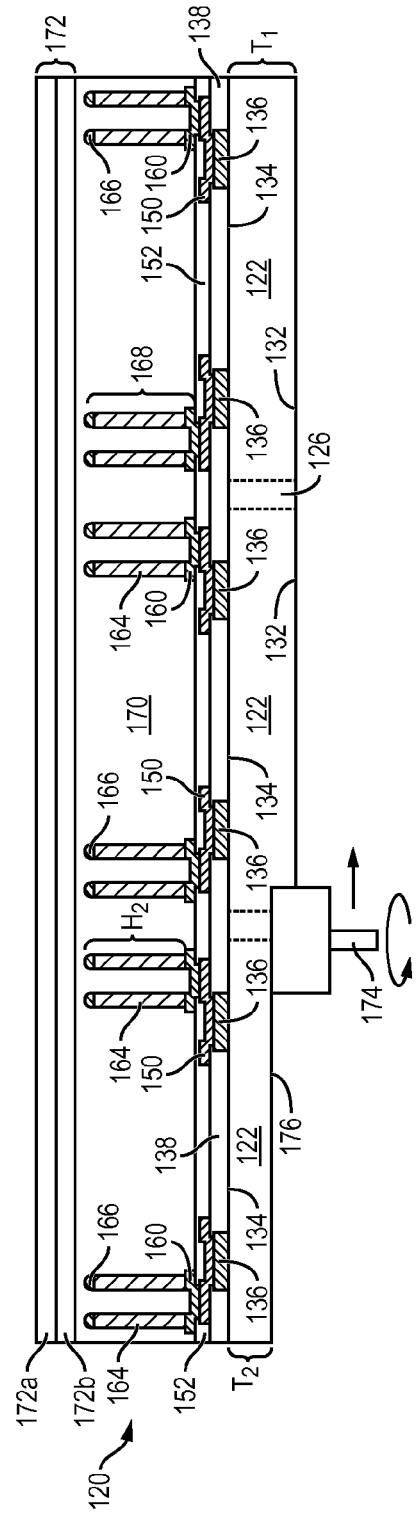

Semiconductor wafer 120 has an initial thickness of $T_1$. In FIG. 2k, back surface 132 of semiconductor wafer 120 is subjected to a back grinding operation with grinder 174 or other suitable mechanical or etching process to remove a portion of base material 122 and reduce the base material to a thickness, $T_2$, which is less than thickness, $T_1$. The removal of base material 122 from back surface 132 is performed as a mechanical process or physical etch process leaving new back surface 176 of semiconductor wafer 120 uniform across the entire width of the semiconductor wafer. Alternatively, a portion of base material 122 is removed from back surface 132 by LDA to expose new back surface 176. In one embodiment, semiconductor wafer 120 has a thickness, $T_2$, of 30-50 µm after the backgrinding or wafer thinning operation. In another embodiment, semiconductor wafer 120 has a thickness, $T_2$, of about 100 µm after the backgrinding or wafer thinning operation. Protective coating 170 over insulating layer 152 and composite interconnect structures 168 reduces kerf shift and accumulation of debris and contaminants on active surface 134 during the backgrinding or wafer thinning operation, as well as subsequent manufacturing processes. Accordingly, protective coating 170 is applied over insulating layer 152 and composite interconnect structures 168 prior to the backgrinding or wafer thinning operation of FIG. 2k.

In FIG. 2l, protective coating 170 over insulating layer 152 and composite interconnect structures 168 is removed by a peel-off or stripping operation. Semiconductor wafer 120 is singulated through saw street 126 using saw blade or laser cutting tool 180 into individual semiconductor die 182 including composite interconnect structures 168 in peripheral region 130. Semiconductor die 182 is electrically connected through contact pads 136 to conductive layer 150. Conductive layer 150 routes signals away from contact pads 136 in central region 128 of semiconductor die 182 to peripheral region 130 of the semiconductor die. Conductive layer 150 of semiconductor die 182 is electrically connected to conductive layer 160. Conductive layer 160 is located in peripheral region 130 of semiconductor die 182. Conductive layer 160 of semiconductor die 182 is electrically connected to conductive pillars 164. Conductive pillars 164 are located in peripheral region 130 of semiconductor die 182. Conductive pillars 164 of semiconductor die 182 are electrically connected to bump caps 166. Bump caps 166 are located in peripheral region 130 of semiconductor die 182. The combination of conductive pillar 164 and bump cap 166 constitutes a composite interconnect structure 168 with a non-fusible portion (conductive pillar 164) and a fusible portion (bump cap 166). Composite interconnect structures 168 are electrically connected to conductive layer 160. A portion of central region 128 of semiconductor die 182 is devoid of composite interconnect structures 168. The portion of central region 128 of semiconductor die 182 which is devoid of conductive interconnect structures 168 corresponds to the footprint of the smaller semiconductor die to be disposed over semiconductor die 182 in a subsequent processing step. Semiconductor die 182 is electrically connected through contact pads 136, conductive layer 150, and conductive layer 160 to composite interconnect structures 168 for external interconnect. Individual semiconductor die 182 can be inspected and electrically tested for identification of KGD post singulation.

FIGS. 3a-3c illustrate, in relation to FIG. 1, plan views of a semiconductor die described in FIGS. 2a-2l showing embodiments of composite interconnect structures in a peripheral region and a central region(s) devoid of composite interconnect structures. FIG. 3a shows a plan view of semiconductor die 182 with composite interconnect structures 168 formed in peripheral region 130. FIG. 3a shows central region 128 of semiconductor die 182 is devoid of composite interconnect structures 168. FIG. 3b shows a column or columns of composite interconnect structures 168 dividing central region 128 of semiconductor die 182 into first region 128a and second region 128b. FIG. 3c shows a row or rows of composite interconnect structures 168 dividing first region 128a of semiconductor die 182 into region 128c and region 128d and second region 128b into region 128e and region 128f. A portion of regions 128a-128f of semiconductor die 182 are devoid of composite interconnect structures 168 to accommodate smaller semiconductor die disposed over the semiconductor die in a subsequent processing step. The portions of regions 128a-128f of semiconductor die 182 which are devoid of composite interconnect structures 168 correspond to the footprints of the smaller semiconductor die to be disposed over semiconductor die 182 in a subsequent processing step.

Figure 4A:
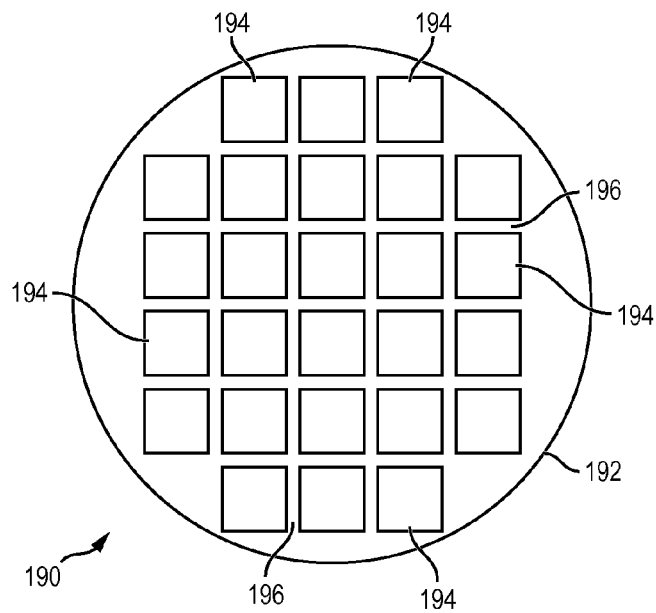
FIGS. 4a-4f illustrate a semiconductor wafer with a plurality of semiconductor die separated by a saw street.

FIGS. 4a-4f illustrate, in relation to FIG. 1, a process of forming a thinned semiconductor die with a footprint smaller than central region 128 of semiconductor die 182. FIG. 4a shows a semiconductor wafer 190, similar to semiconductor wafer 120, with a base substrate material 192, such as silicon, germanium, aluminum phosphide, aluminum arsenide, gallium arsenide, gallium nitride, indium phosphide, silicon carbide, or other bulk semiconductor material for structural support. A plurality of semiconductor die or components 194 is formed on wafer 190 separated by a non-active, inter-die wafer area or saw street 196 as described above. Saw street 196 provides cutting areas to singulate semiconductor wafer 190 into individual semiconductor die 194. In one embodiment, semiconductor wafer 190 has a width or diameter of 100-450 mm. The footprint of semiconductor die 194 is smaller than central region 128 of semiconductor die 182. Central region 128 of semiconductor die 182 is larger than the footprint of semiconductor die 182.

Figure 4B:
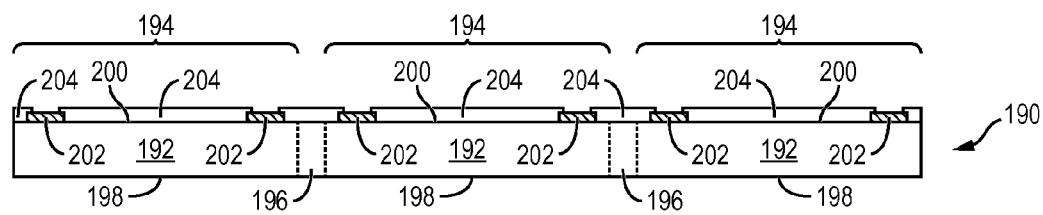

FIG. 4b shows a cross-sectional view of a portion of semiconductor wafer 190. Semiconductor wafer 190 has an initial thickness of $T_3$. Each semiconductor die 194 has a back or non-active surface 198 and active surface 200 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 200 to implement analog circuits or digital circuits, such as DSP, ASIC, memory, or other signal processing circuit. Semiconductor die 194 may also contain IPDs, such as inductors, capacitors, and resistors, for RF signal processing.

An electrically conductive layer 202 is formed over active surface 200 using PVD, CVD, electrolytic plating, electroless plating process, or other suitable metal deposition process. Conductive layer 202 can be one or more layers of Al, Cu, Sn, Ni, Au, Ag, or other suitable electrically conductive material. Conductive layer 202 operates as contact pads electrically connected to the circuits on active surface 200. Conductive layer 202 can be formed as contact pads disposed side-by-side a first distance from the edge of semiconductor die 194, as shown in FIG. 4b. Alternatively, conductive layer 202 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 204 is formed over active surface 200 and conductive layer 202 using PVD, CVD, screen printing, spin coating, spray coating, sintering, or thermal oxidation. The insulating layer 204 contains one or more layers of $SiO_2$, $Si_3N_4$, SiON, $Ta_2O_5$, $Al_2O_3$, or other material having similar insulating and structural properties. The insulating layer 204 covers and provides protection for active surface 200. A portion of insulating layer 204 is removed by etching, LDA, or other suitable process to expose conductive layer 202 for subsequent electrical interconnect.

Figure 4C:
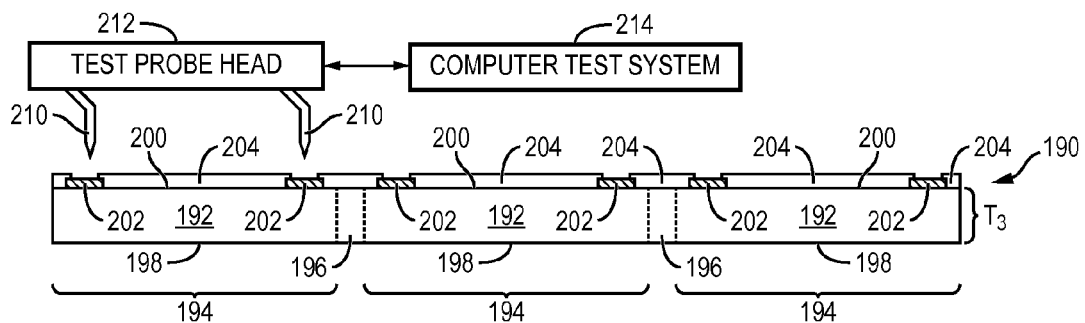

In FIG. 4c, semiconductor wafer 190 undergoes electrical testing and inspection as part of a quality control process. Manual visual inspection and automated optical systems are used to perform inspections on semiconductor wafer 190. Software can be used in the automated optical analysis of semiconductor wafer 190. Visual inspection methods may employ equipment such as a scanning electron microscope, high-intensity or ultra-violet light, or metallurgical microscope. Semiconductor wafer 190 is inspected for structural characteristics including warpage, thickness variation, surface particulates, irregularities, cracks, delamination, and discoloration.

The active and passive components within semiconductor die 194 undergo testing at the wafer level for electrical performance and circuit function. Each semiconductor die 194 is tested for functionality and electrical parameters using a probe or other testing device. Test probe head 212 includes a plurality of probes 210. Probes 210 are used to make electrical contact with contact pads 202 on each semiconductor die 194 and provides electrical stimuli to the contact pads. Semiconductor die 194 responds to the electrical stimuli, which is measured by computer test system 214 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 190 enables semiconductor die 194 that pass to be designated as KGD for use in a semiconductor package.

Figure 4D:
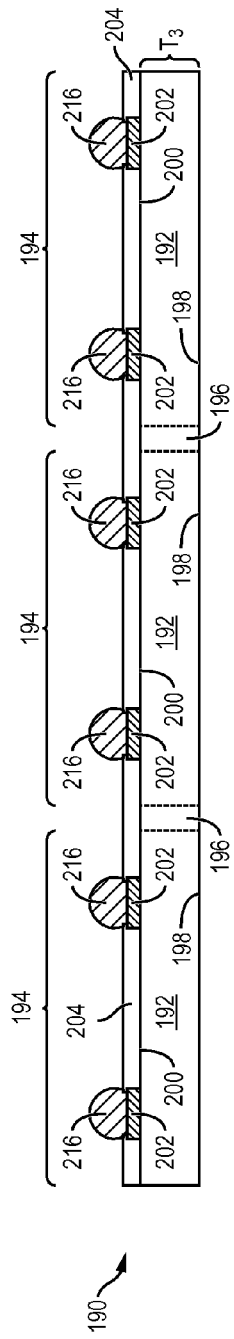

In FIG. 4d, an electrically conductive bump material is deposited over contact pads 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 202 using a suitable attachment or bonding process. In one embodiment, the bump material is reflowed by heating the material above its melting point to form balls or bumps 216. In some applications, bumps 216 are reflowed a second time to improve electrical contact to contact pads 202. Bumps 216 can also be compression bonded or thermocompression bonded to contact pads 202. Bumps 216 represent one type of interconnect structure that can be formed over contact pads 202. The interconnect structure can also use stud bump, micro bump, or other electrical interconnect. Bumps 216 are electrically connected to contact pads 202 of semiconductor die 194.

Figure 4E:
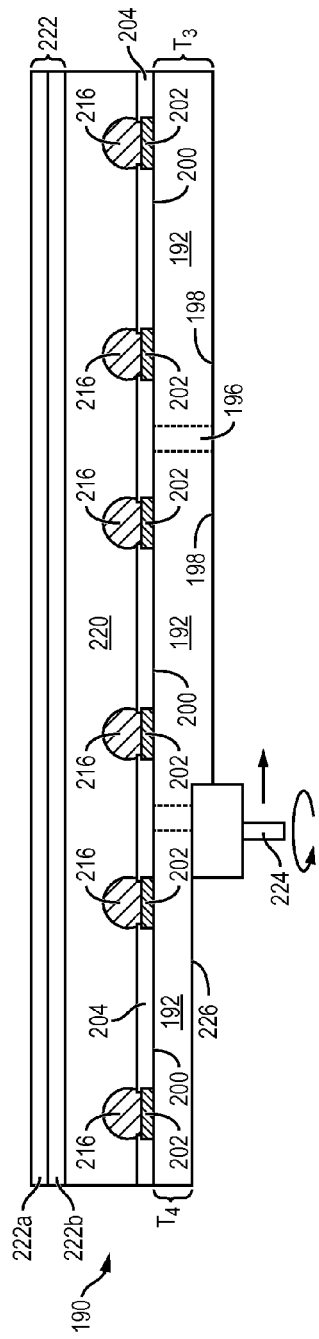

In FIG. 4e, a protective coating 220 is formed over insulating layer 204 and bumps 216 across an entire area of semiconductor wafer 190. Protective coating 220 can be one or more layers of a water soluble polymer material applied by screen printing, spin coating, spray coating, or other suitable deposition process. A lamination tape 222 is applied over protective coating 220 across an entire area of semiconductor wafer 190. In one embodiment, lamination tape 222 includes a dielectric base film 222a and adhesive layer 222b, as shown in the cross-sectional view of a portion of semiconductor wafer 190 in FIG. 4e.

In FIG. 4e, back surface 198 of semiconductor wafer 190 is subjected to a back grinding operation with grinder 224 or other suitable mechanical or etching process to remove a portion of base material 192 and reduce the base material to a thickness, $T_4$, which is less than thickness, $T_3$. The removal of base material 192 from back surface 198 is performed as a mechanical process or physical etch process leaving new back surface 226 of semiconductor wafer 190 uniform across the entire width of the semiconductor wafer. Alternatively, a portion of base material 192 is removed from back surface 198 by LDA to expose new back surface 226. In one embodiment, semiconductor wafer 190 has a thickness, $T_4$, of 30-50 μm after the backgrinding or wafer thinning operation. In another embodiment, semiconductor wafer 120 has a thickness, $T_4$, of about 100 μm after the backgrinding or wafer thinning operation. Thickness, $T_4$, of semiconductor wafer 190 after the backgrinding or wafer thinning operation is less than height, $H_2$, of composite interconnect structures 168 of semiconductor die 182. Protective coating 220 over insulating layer 204 and bumps 216 reduces kerf shift and accumulation of debris and contaminants on active surface 200 during the backgrinding or wafer thinning operation, as well as subsequent manufacturing processes. Accordingly, protective coating 220 is applied over insulating layer 204 and bumps 216 prior to the backgrinding or wafer thinning operation of FIG. 4e.

Figure 4F:
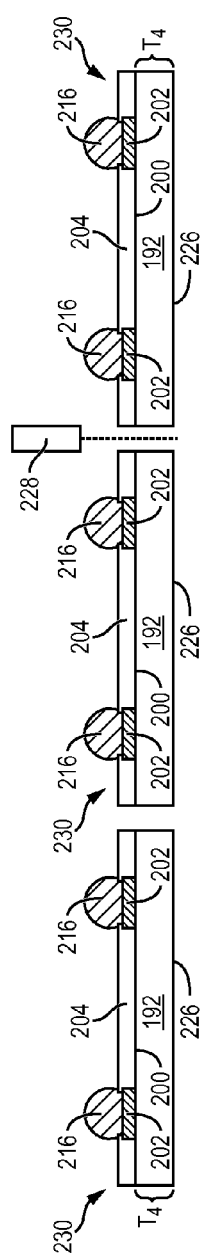

In FIG. 4f, protective coating 220 over insulating layer 204 and bumps 216 is removed by a peel-off or stripping operation. Semiconductor wafer 190 is singulated through saw street 196 using saw blade or laser cutting tool 228 into individual bumped semiconductor die 230. Semiconductor die 230 is electrically connected through contact pads 202 to bumps 216 for external interconnect. Semiconductor die 230 have thickness, $T_4$, less than height, $H_2$, of composite interconnect structures 168 of semiconductor die 182. Height, $H_2$, of composite interconnect structures 168 of semiconductor die 182 is larger than thickness, $T_4$, of semiconductor die 230. The footprint of semiconductor die 230 is smaller than central region 128 of semiconductor die 182. Semiconductor die 230 with thickness, $T_4$, less than height, $H_2$, of composite interconnect structures 168 of semiconductor die 182 and footprint less than central region 128 of semiconductor die 182 will fit beneath central region 128 of semiconductor die 182. Semiconductor die 182 is disposed over semiconductor die 230 in a subsequent processing step. Semiconductor die 230 can be inspected and electrically tested for identification of KGD post singulation.

Figure 5A:
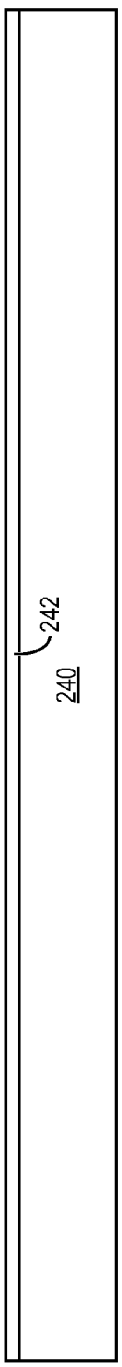

FIGS. 5a-5i illustrate, in relation to FIG. 1, a process of forming a single side FO-WLCSP with stacked thinned semiconductor die. FIG. 5a shows a substrate or carrier 240 containing temporary or sacrificial base material such as silicon, polymer, beryllium oxide, glass, or other suitable low-cost, rigid material for structural support. An interface layer or double-sided tape 242 is formed over carrier 240 as a temporary adhesive bonding film, etch-stop layer, or thermal release layer.

Figure 5B:
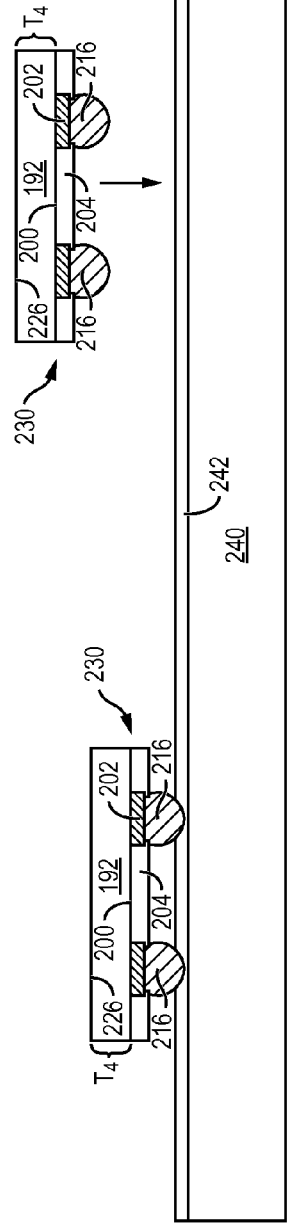

In FIG. 5b, semiconductor die 230 from FIG. 4f are mounted to carrier 240 and interface layer 242 using, for example, a pick and place operation with active surface 200 oriented toward the carrier. Semiconductor die 230 have thickness, $T_4$, less than height, $H_2$, of composite interconnect structures 168 of semiconductor die 182. The footprint of semiconductor die 230 is smaller than central region 128 of semiconductor die 182.

Figure 5C:
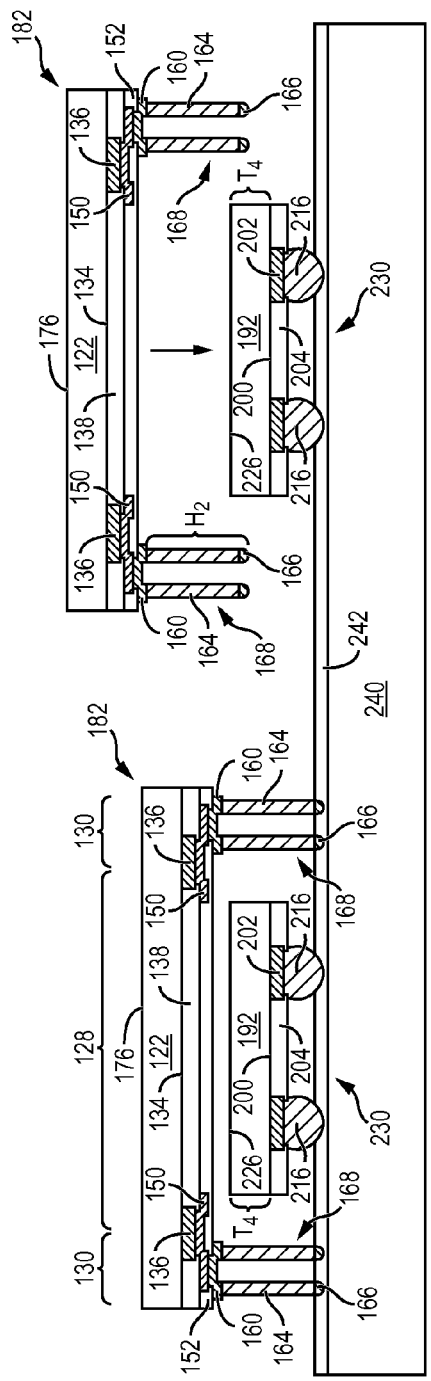
Figure 5D:
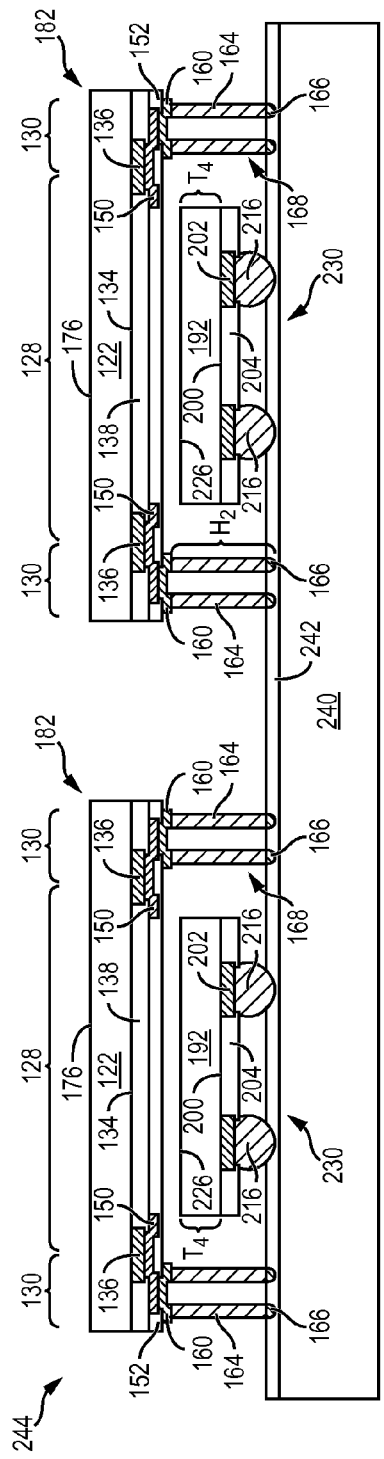

After placing semiconductor die 230 from FIG. 4f, semiconductor die 182 from FIG. 2l are mounted to carrier 240 and interface layer 242 over semiconductor die 230 using, for example, a pick and place operation with active surface 134 oriented toward the carrier, as shown in FIG. 5c. Semiconductor die 230 have thickness, $T_4$, less than height, $H_2$, of composite interconnect structures 168 of semiconductor die 182. Semiconductor die 230 have a footprint less than central region 128 of semiconductor die 182. Accordingly, semiconductor die 230 is disposed over central region 128 of semiconductor die 182. A portion of central region 128 of semiconductor die 182 is devoid of composite interconnect structures 168 to accommodate smaller semiconductor die 230 disposed over semiconductor die 182. The portion of central region 128 of semiconductor die 182 which is devoid of composite interconnect structures 168 corresponds to the footprint of the smaller semiconductor die 230 disposed over semiconductor die 182. Semiconductor die 230 is disposed between central region 128 of semiconductor die 182 and carrier 240. Active surface 134 of semiconductor die 182 is oriented toward back surface 226 of semiconductor die 230. Composite interconnect structures 168 are located in peripheral region 130 of semiconductor die 182 to provide connectivity of semiconductor die 182 to the single side FO-WLCSP without using TSVs or THVs. Accordingly, the single side FO-WLCSP is able to achieve lower costs, higher UPH production, and increased device reliability by eliminating TSVs and THVs. Composite interconnect structures 168 of semiconductor die 182 surround or encircle semiconductor die 230. Semiconductor die 230 is disposed between composite interconnect structures 168 of semiconductor die 182. Composite interconnect structures 168 have a height, $H_2$, greater than a thickness, $T_4$, of thinned semiconductor die 230. FIG. 5d shows semiconductor die 182 and 230 mounted to interface layer 242 of carrier 240 as reconstituted or reconfigured wafer 244.

Figure 5E:
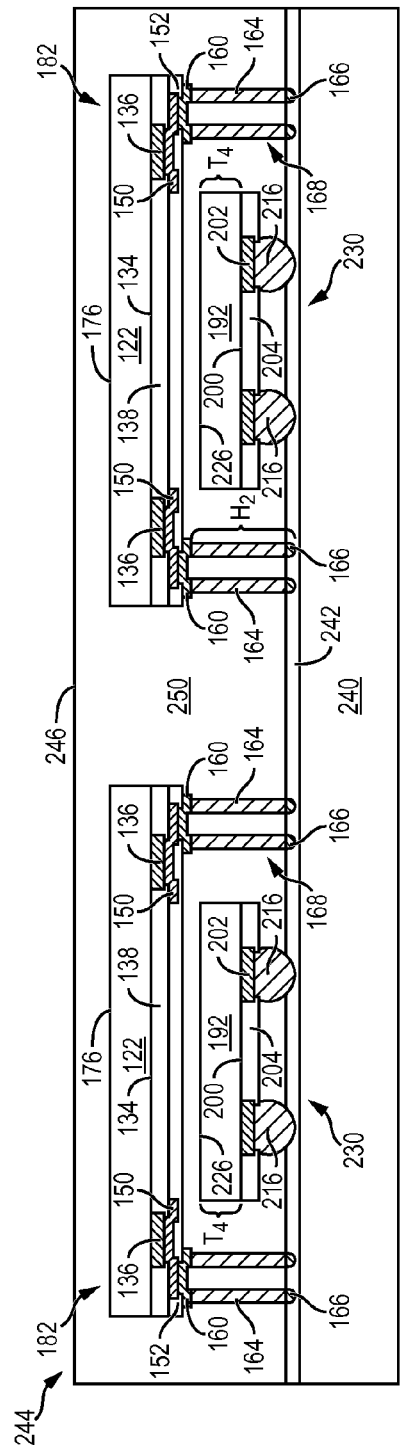

In FIG. 5e, an encapsulant or molding compound 250 is deposited over semiconductor die 182, semiconductor die 230, and carrier 240 using a paste printing, compressive molding, transfer molding, liquid encapsulant molding, vacuum lamination, or other suitable applicator. Encapsulant 250 can be polymer composite material, such as epoxy resin with filler, epoxy acrylate with filler, or polymer with proper filler. Encapsulant 250 is non-conductive and environmentally protects the semiconductor device from external elements and contaminants. In one embodiment, encapsulant 250 is deposited using film-assisted molding process. Surface 246 of encapsulant 250 may undergo an optional grinding operation to planarize the surface and reduce the thickness of the encapsulant. Grinding surface 246 of encapsulant 250 to reduce the thickness of the encapsulant reduces the overall thickness of the final semiconductor device, thus enabling the final semiconductor device to be utilized in applications requiring a reduced thickness. Decreasing the thickness of the final semiconductor device increases market demand for the final semiconductor device.

In FIG. 5f, carrier 240 and interface layer 242 are removed by chemical etching, mechanical peeling, CMP, mechanical grinding, thermal bake, UV light, laser scanning, or wet stripping. Removing carrier 240 and interface layer 242 exposes encapsulant 250, active surface 200 and bumps 216 of semiconductor die 230, and composite interconnect structure 168 of semiconductor die 182. Composite interconnect structure 168 of semiconductor die 182 surround or encircle active surface 200 and bumps 216 of semiconductor die 230. Active surface 200 and bumps 216 of semiconductor die 230 are bounded by composite interconnect structure 168 of semiconductor die 182. Composite interconnect structure 168 of semiconductor die 182 are formed in peripheral region 130 of semiconductor die 182 while semiconductor die 230 is disposed over central region 128 of semiconductor die 182.

In FIG. 5g, a build-up interconnect structure 252 is formed over reconstituted wafer 244. Build-up interconnect structure 252 includes an electrically conductive layer or RDL 254 formed using a patterning and metal deposition process such as sputtering, electrolytic plating, and electroless plating. Conductive layer 254 can be one or more layers of Al, Cu, Sn, Ni, Au, Ag, or other suitable electrically conductive material. One portion of conductive layer 254 is electrically connected to contact pads 202 of semiconductor die 230. Another portion of conductive layer 254 is electrically connected to composite interconnect structures 168 of semiconductor die 182. Other portions of conductive layer 254 can be electrically common or electrically isolated depending on the design and function of the final semiconductor device. Build-up interconnect structure 252 further includes an insulating or passivation layer 256 formed between conductive layers 254 for electrical isolation. Insulating layer 256 contains one or more layers of SiO2, Si3N4, SiON, Ta2O5, Al2O3, or other material having similar insulating and structural properties. Insulating layer 256 is formed using PVD, CVD, printing, spin coating, spray coating, sintering or thermal oxidation. A portion of insulating layer 256 is removed by an etching process to expose conductive layer 254 for bump formation or additional package interconnect.

Figure 5H:
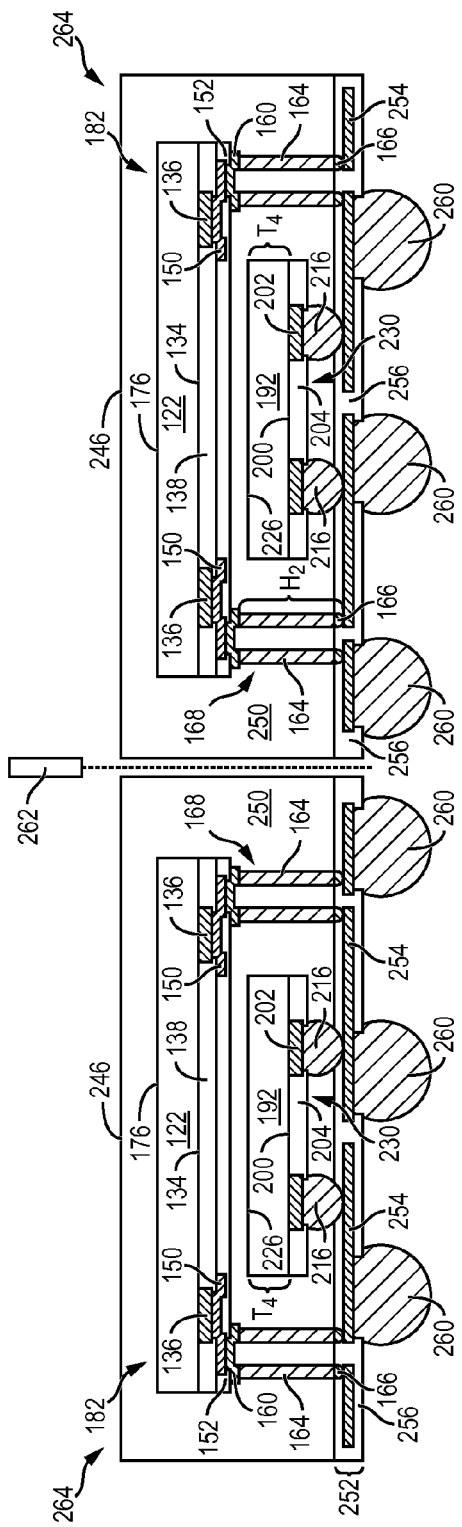

In FIG. 5h, bumps are formed over conductive layer 254. An electrically conductive bump material is deposited over conductive layer 254 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 254 using a suitable attachment or bonding process. In one embodiment, the bump material is reflowed by heating the material above its melting point to form spherical balls or bumps 260. In some applications, bumps 260 are reflowed a second time to improve electrical contact to conductive layer 254. In one embodiment, bumps 260 are formed over an under bump metallization (UBM) having a wetting layer, barrier layer, and adhesive layer. The bumps can also be compression bonded or thermocompression bonded to conductive layer 254. Bumps 260 are electrically connected to conductive layer 254. Bumps 260 represent one type of interconnect structure that can be formed over conductive layer 254. The interconnect structure can also use bond wires, conductive paste, stud bump, micro bump, or other electrical interconnect. Reconstituted wafer 244 is singulated through encapsulant 250 with saw blade or laser cutting tool 262 into separate single side FO-WLCSP 264.

Figure 5I:
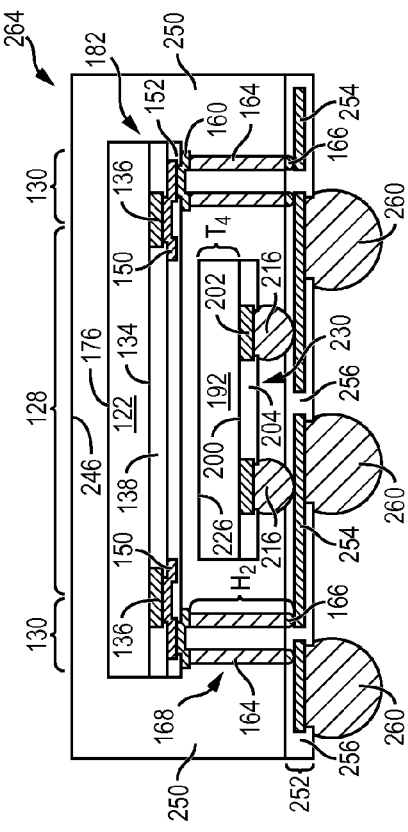

FIG. 5i shows single side FO-WLCSP 264 with stacked thinned semiconductor die 182 and 230. Conductive layer 150 of semiconductor die 182 routes signals from central region 128 to peripheral region 130, allowing a portion of central region 128 to be free of composite interconnect structures 168 to accommodate stacking with smaller semiconductor die 230. The portion of central region 128 of semiconductor die 182 which remains free of composite interconnect structures 168 corresponds to the footprint of smaller semiconductor die 230 disposed over semiconductor die 182. Semiconductor die 182 is electrically connected through contact pads 136 to conductive layer 150. Conductive layer 150 routes signals away from contact pads 136 in central region 128 of semiconductor die 182 to peripheral region 130 of the semiconductor die. Conductive layer 150 of semiconductor die 182 is electrically connected to conductive layer 160. Conductive layer 160 is located in peripheral region 130 of semiconductor die 182. A portion of central region 128 of semiconductor die 182 is devoid of conductive layer 160. The portion of central region 128 of semiconductor die 182 which is devoid of conductive layer 160 corresponds to the footprint of smaller semiconductor die 230 disposed over semiconductor die 182. Conductive layer 160 of semiconductor die 182 is electrically connected to conductive pillars 164. Conductive pillars 164 are located in peripheral region 130 of semiconductor die 182. A portion of central region 128 of semiconductor die 182 is devoid of conductive pillars 164. The portion of central region 128 of semiconductor die 182 which is devoid of conductive pillars 164 corresponds to the footprint of smaller semiconductor die 230 disposed over semiconductor die 182. Conductive pillars 164 of semiconductor die 182 are electrically connected to bump caps 166. Bump caps 166 are located in peripheral region 130 of semiconductor die 182. A portion of central region 128 of semiconductor die 182 is devoid of bump caps 166. The portion of central region 128 of semiconductor die 182 which is devoid of bump caps 166 corresponds to the footprint of smaller semiconductor die 230 disposed over semiconductor die 182. The combination of conductive pillar 164 and bump cap 166 constitutes a composite interconnect structure 168 with a non-fusible portion (conductive pillar 164) and a fusible portion (bump cap 166). Composite interconnect structure 168 is electrically connected to conductive layer 160. Semiconductor die 182 is electrically connected through contact pads 136, conductive layer 150, conductive layer 160, and composite interconnect structures 168 to a portion of conductive layer 254 for external interconnect. Semiconductor die 230 is electrically connected through contact pads 202 and bumps 216 to a portion of conductive layer 254 for external interconnect. One portion of conductive layer 254 is electrically connected to bumps 216 of semiconductor die 230. Another portion of conductive layer 254 is electrically connected to composite interconnect structures 168 of semiconductor die 182. Other portions of conductive layer 254 can be electrically common or electrically isolated depending on the design and function of single side FO-WLCSP 264. Bumps 260 are electrically connected to conductive layer 254. Single side FO-WLCSP 264 provides single side connectivity from semiconductor die 182 and semiconductor die 230 through conductive layer 254 to external interconnections without the use of TSVs and THVs, saving considerable time and expense. Avoiding the use of TSVs and THVs increases the UPH production and decreases cost. Furthermore, avoiding the use of TSVs and THVs eliminates the formation of voids that reduce device reliability, and eliminates problems with semiconductor die placement accuracy and warpage control associated with via formation. Thinning of encapsulant 250 and semiconductor die 182 and 230 allow reduction in thickness of single side FO-WLCSP 264. Stacking of semiconductor die 182 and 230 allow significant reduction of the footprint of single side FO-WLCSP 264. Reductions in package thickness and footprint of single side FO-WLCSP 264 increase the number of suitable applications for single side FO-WLCSP 264, thus increasing market demand for the semiconductor device.

Figure 6E:
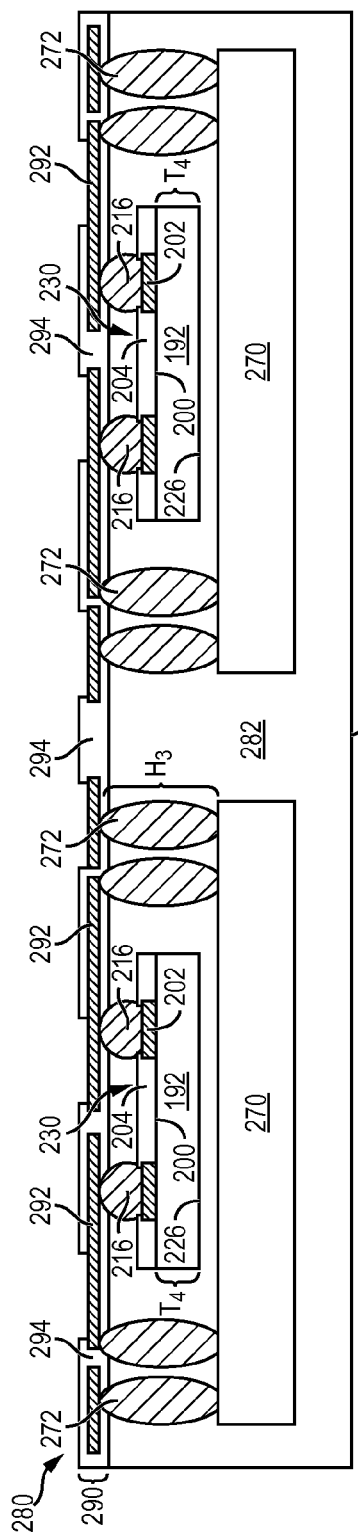

In another embodiment, continuing from FIG. 5b, FIGS. 6a-6g illustrate, in relation to FIG. 1, an alternate process of forming a single side fo-WLCSP with semiconductor package and thinned semiconductor die. After placing semiconductor die 230 from FIG. 4f, a semiconductor package or device 270 is mounted to carrier 240 and interface layer 242 over semiconductor die 230 using, for example, a pick and place operation with bumps 272 oriented toward the carrier, as shown in FIG. 6a. Semiconductor device 270 may include filter, memory, or other IC chips, processors, microcontrollers, known-good packages, or any other packaged device containing semiconductor die or other electronic devices or circuitry. Bumps 272 have height $H_3$ greater than thickness, $T_4$, of thinned semiconductor die 230. Bumps 272 represent one type of interconnect structure that can be formed over semiconductor device 270. The interconnect structure can also use conductive pillars, conductive paste, stacked stud bumps, or other electrical interconnect. A portion of central region 274 of semiconductor device 270 is devoid of bumps 272 to accommodate smaller semiconductor die 230 disposed over semiconductor device 270. The portion of central region 274 of semiconductor device 270 which is devoid of bumps 272 corresponds to the footprint of the smaller semiconductor die 230 disposed over semiconductor device 270. Semiconductor die 230 is disposed between central region 274 of semiconductor device 270 and carrier 240. Bumps 272 are located in peripheral region 276 of semiconductor device 270 to provide connectivity between the circuits of semiconductor device 270 and the single side fo-WLCSP without using TSVs and THVs. Avoiding the use of TSVs and THVs increases the UPH production and decreases cost. Furthermore, avoiding the use of TSVs and THVs eliminates the formation of voids that reduce device reliability, and eliminates problems with semiconductor die placement accuracy and warpage control associated with via formation. Bumps 272 of semiconductor device 270 surround or encircle semiconductor die 230. Semiconductor die 230 is disposed between bumps 272 of semiconductor device 270. FIG. 6b shows semiconductor device 270 and semiconductor die 230 mounted to interface layer 242 of carrier 240 as reconstituted or reconfigured wafer 280.

In FIG. 6c, an encapsulant or molding compound 282 is deposited over semiconductor device 270, semiconductor die 230, and carrier 240 using a paste printing, compressive molding, transfer molding, liquid encapsulant molding, vacuum lamination, or other suitable applicator. Encapsulant 282 can be polymer composite material, such as epoxy resin with filler, epoxy acrylate with filler, or polymer with proper filler. Encapsulant 282 is non-conductive and environmentally protects the semiconductor device from external elements and contaminants. In one embodiment, encapsulant 282 is deposited using film-assisted molding process. Surface 284 of encapsulant 282 may undergo an optional grinding operation to planarize the surface and reduce the thickness of the encapsulant. Grinding surface 284 of encapsulant 282 to reduce the thickness of the encapsulant reduces the overall thickness of the final semiconductor device, thus enabling the final semiconductor device to be utilized in applications requiring a reduced thickness. Decreasing the thickness of the final semiconductor device increases market demand for the final semiconductor device.

In FIG. 6d, carrier 240 and interface layer 242 are removed by chemical etching, mechanical peeling, CMP, mechanical grinding, thermal bake, UV light, laser scanning, or wet stripping. Removing carrier 240 and interface layer 242 exposes active surface 200 and bumps 216 of semiconductor die 230 and bumps 272 of semiconductor device 270. Bumps 272 of semiconductor device 270 surround or encircle active surface 200 and bumps 216 of semiconductor die 230. Active surface 200 and bumps 216 of semiconductor die 230 are bounded by bumps 272 of semiconductor device 270. Bumps 272 of semiconductor device 270 are formed in peripheral region 276 of semiconductor device 270 while semiconductor die 230 is disposed over central region 274 of semiconductor device 270.

In FIG. 6e, a build-up interconnect structure 290 is formed over reconstituted wafer 280. Build-up interconnect structure 290 includes an electrically conductive layer or RDL 292 formed using a patterning and metal deposition process such as sputtering, electrolytic plating, and electroless plating. Conductive layer 292 can be one or more layers of Al, Cu, Sn, Ni, Au, Ag, or other suitable electrically conductive material. One portion of conductive layer 292 is electrically connected to contact pads 202 of semiconductor die 230. Another portion of conductive layer 292 is electrically connected to bumps 272 of semiconductor device 270. Other portions of conductive layer 292 can be electrically common or electrically isolated depending on the design and function of the final semiconductor device. Build-up interconnect structure 290 further includes an insulating or passivation layer 294 formed between conductive layers 292 for electrical isolation. Insulating layer 294 contains one or more layers of $SiO_2$, $Si_3N_4$, SiON, $Ta_2O_5$, $Al_2O_3$, or other material having similar insulating and structural properties. Insulating layer 294 is formed using PVD, CVD, printing, spin coating, spray coating, sintering or thermal oxidation. A portion of insulating layer 294 is removed by an etching process to expose conductive layer 292 for bump formation or additional package interconnect.

Figure 6F:
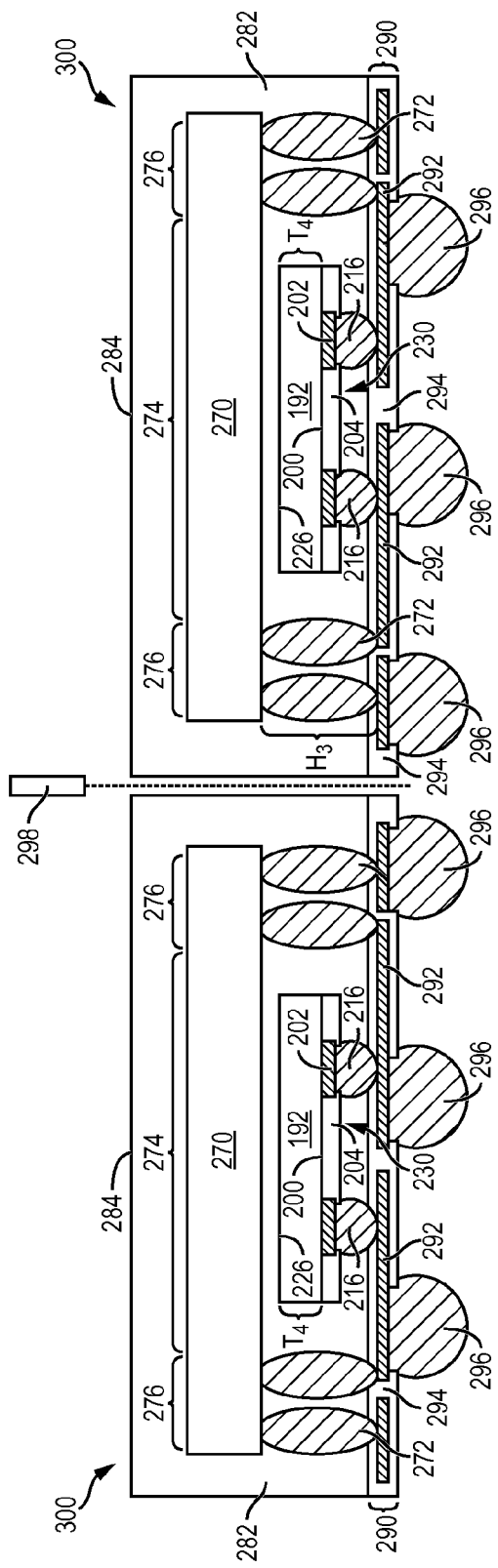

In FIG. 6f, bumps are formed over conductive layer 292. An electrically conductive bump material is deposited over conductive layer 292 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 292 using a suitable attachment or bonding process. In one embodiment, the bump material is reflowed by heating the material above its melting point to form spherical balls or bumps 296. In some applications, bumps 296 are reflowed a second time to improve electrical contact to conductive layer 292. In one embodiment, bumps 296 are formed over a UBM having a wetting layer, barrier layer, and adhesive layer. The bumps can also be compression bonded or thermocompression bonded to conductive layer 292. Bumps 296 are electrically connected to conductive layer 292. Bumps 296 represent one type of interconnect structure that can be formed over conductive layer 292. The interconnect structure can also use bond wires, conductive paste, stud bump, micro bump, or other electrical interconnect. Reconstituted wafer 280 is singulated through encapsulant 282 with saw blade or laser cutting tool 298 into separate single side fo-WLCSP 300.

Figure 6G:
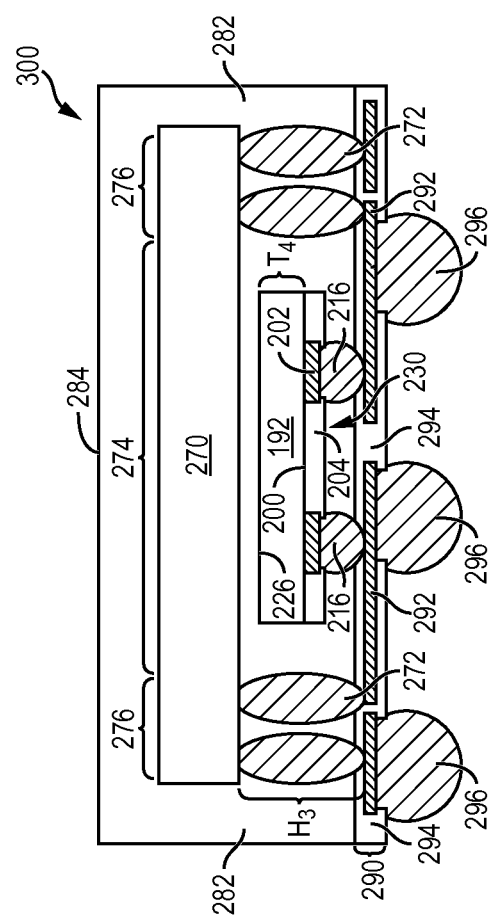

FIG. 6g shows single side fo-WLCSP 300 with stacked thinned semiconductor die 230 and semiconductor device 270. A portion of central region 274 of semiconductor device 270 is devoid of bumps 272 to accommodate stacking with smaller semiconductor die 230. Bumps 272 provide connectivity from semiconductor device 270 to single side fo-WLCSP 300 without the use of TSVs and THVs, saving considerable time and expense. Semiconductor device 270 may include filter, memory, or other IC chips, processors, microcontrollers, known-good packages, or any other packaged device containing semiconductor die or other electronic devices or circuitry. Semiconductor device 270 is electrically connected to bumps 272 for external interconnect. Semiconductor die 230 is electrically connected through contact pads 202 to bumps 216 for external interconnect. One portion of conductive layer 292 is electrically connected to contact pads 202 of semiconductor die 230. Another portion of conductive layer 292 is electrically connected to bumps 272 of semiconductor device 270. Bumps 296 are electrically connected to conductive layer 292. Single side fo-WLCSP 300 provides single side connectivity from semiconductor die 230 and semiconductor device 270 through conductive layer 292 to external interconnections without the use of TSVs and THVs, saving considerable time and expense. Avoiding the use of TSVs and THVs increases the UPH production and decreases cost. Furthermore, avoiding the use of TSVs and THVs eliminates the formation of voids that reduce device reliability, and eliminates problems with semiconductor die placement accuracy and warpage control associated with via formation. Thinning of encapsulant 282 and semiconductor die 230 allow reduction in thickness of single side fo-WLCSP 300. Stacking of semiconductor die 230 and semiconductor device 270 allow significant reduction of the footprint of single side fo-WLCSP 300. Reductions in package thickness and footprint of single side fo-WLCSP 300 increase the number of suitable applications for single side fo-WLCSP 300, thus increasing market demand for the semiconductor device.

While one or more embodiments of the present invention have been illustrated in detail, the skilled artisan will appreciate that modifications and adaptations to the embodiments may be made without departing from the scope of the present invention as set forth in the following claims.

What is claimed:

1. A method of making a semiconductor device, comprising:
   providing a first semiconductor die including a plurality of contact pads formed over a central region of the first semiconductor die;
   forming a first conductive layer over the first semiconductor die and extending from the contact pads to a peripheral region of the first semiconductor die;
   forming a plurality of first interconnect structures over the first conductive layer in the peripheral region of the first semiconductor die;
   forming a first protective coating over the first semiconductor die and around the first interconnect structures;
   removing a portion of the first semiconductor die opposite the first interconnect structures after forming the first protective coating;
   removing the first protective coating after removing the portion of the first semiconductor die;
   providing a second semiconductor die including a plurality of bumps formed on an active surface of the second semiconductor die;
   disposing the first semiconductor die over the second semiconductor die with the bumps oriented away from the first semiconductor die and with the first interconnect structures disposed around the second semiconductor die;
   depositing an encapsulant around the first semiconductor die and second semiconductor die; and
   forming a second conductive layer contacting the bumps and first interconnect structures.

2. The method of claim 1, further including removing a portion of the second semiconductor die.

3. The method of claim 1, further including:
   forming a second protective coating over the second semiconductor die;
   removing a portion of the second semiconductor die after forming the second protective coating; and
   removing the second protective coating after removing the portion of the second semiconductor die.

4. The method of claim 1, wherein the first protective coating includes a water soluble polymer material.

5. The method of claim 1, wherein the first interconnect structures include a non-fusible portion and a fusible portion.

6. The method of claim 1, further including forming a plurality of second interconnect structures across the central region of the first semiconductor die to divide the central region of the first semiconductor die into first and second regions devoid of the first and second interconnect structures.

7. The method of claim 6, further including:
   disposing the second semiconductor die in the first region; and
   disposing a third semiconductor die in the second region.

8. A method of making a semiconductor device, comprising:
   providing a first semiconductor die;
   forming a first conductive layer over the first semiconductor and extending from a central region of the first semiconductor die to a peripheral region of the first semiconductor die;
   forming a plurality of first interconnect structures over the first conductive layer in the peripheral region of the first semiconductor die;
   providing a second semiconductor die including a plurality of bumps formed over an active surface of the second semiconductor die;
   providing a carrier;
   disposing the second semiconductor die over the carrier with the bumps oriented toward the carrier;
   disposing the first semiconductor die with the first interconnect structures over the second semiconductor die on the carrier, wherein the first interconnect structures are disposed around the second semiconductor die;
   depositing an encapsulant over the first semiconductor die, second semiconductor die, and carrier and further around the first interconnect structures;
   removing the carrier; and
   forming a second interconnect structure over the encapsulant and in contact with the first interconnect structures and bumps after removing the carrier.

9. The method of claim 8, further including removing a portion of the first semiconductor die after forming the first interconnect structures.

10. The method of claim 8, wherein forming the first interconnect structures includes forming a plurality of conductive pillars.

11. The method of claim 8, further including:
    forming a protective coating over an active surface of the first semiconductor die;
    removing a portion of the first semiconductor die opposite the active surface after forming the protective coating; and
    removing the protective coating after removing the portion of the first semiconductor die.

12. The method of claim 8, further including forming a plurality of second interconnect structures across the central region of the first semiconductor die to divide the central region of the first semiconductor die into a first region and a second region devoid of the first and second interconnect structures.

13. The method of claim 12, further including:
disposing the second semiconductor die in the first region; and
disposing a third semiconductor die in the second region.

14. The method of claim 8, further including forming a second conductive layer over the first interconnect structures and active surface of the second semiconductor die after depositing the encapsulant.

15. The method of claim 8, further including:
forming a protective coating over the second semiconductor die;
removing a portion of the second semiconductor die after forming the protective coating; and
removing the protective coating after removing the portion of the second semiconductor die.

16. A semiconductor device, comprising:
a first semiconductor die;
a plurality of first interconnect structures formed over a peripheral region of the first semiconductor die;
a second semiconductor die disposed over the first semiconductor die and between the first interconnect structures with an active surface of the second semiconductor die oriented away from the first semiconductor die and a gap between the first semiconductor die and second semiconductor die;
a plurality of second interconnect structures formed on the active surface of the second semiconductor die opposite the first semiconductor die;
an encapsulant deposited around the first semiconductor die and second semiconductor die and further in the gap over an entirety of a second surface of the second semiconductor die opposite the active surface; and
a first conductive layer formed over and contacting the first interconnect structures and second interconnect structures.

17. The semiconductor device of claim 16, wherein a height of the second semiconductor die is less than a height of the first interconnect structures.

18. The semiconductor device of claim 16, wherein the first interconnect structures include:
a conductive pillar; and
a bump formed over the conductive pillar.

19. The semiconductor device of claim 16, further including a plurality of third interconnect structures formed across a central region of the first semiconductor die and dividing the central region of the first semiconductor die into a first region and second region devoid of the first and third interconnect structures.

20. The semiconductor device of claim 19, wherein the second semiconductor die is disposed in the first region between the first and third interconnect structures.

21. The semiconductor device of claim 20, further including a third semiconductor die disposed in the second region between the first and third interconnect structures.

22. The semiconductor device of claim 16, further including a second conductive layer extending from a contact pad in a central region of the first semiconductor die to the peripheral region of the first semiconductor die.

23. A method of making a semiconductor device, comprising:
providing a first semiconductor die;
forming a plurality of first interconnect structures over the first semiconductor die;
providing a second semiconductor die including a plurality of bumps formed over an active surface of the second semiconductor die;
providing a carrier;
disposing the second semiconductor die over the carrier with the bumps oriented toward the carrier;
disposing the first semiconductor die with the first interconnect structures over the second semiconductor die on the carrier, wherein the second semiconductor die is disposed between the first interconnect structures and the first interconnect structures contact the carrier leaving a gap between the first semiconductor die and second semiconductor die;
depositing an encapsulant over the first semiconductor die, second semiconductor die, and carrier and further around the first interconnect structures and in the gap over an entirety of a second surface of the second semiconductor die opposite the active surface;
removing the carrier; and
forming a second interconnect structure over the encapsulant and in contact with the first interconnect structures and bumps after removing the carrier.

24. The method of claim 23, further including:
forming a protective coating over the first semiconductor die and around the first interconnect structures;
removing a portion of the first semiconductor die after forming the protective coating; and
removing the protective coating after removing the portion of the first semiconductor die.

25. The method of claim 24, wherein the protective coating includes a water soluble polymer material.

26. The method of claim 23, further including:
forming a protective coating over the second semiconductor die;
removing a portion of the second semiconductor die after forming the protective coating;
removing the protective coating after removing the portion of the second semiconductor die.

27. The method of claim 23, wherein forming the first interconnect structures includes forming a plurality of conductive pillars.

* * * * *